United States Patent
Kim et al.

(10) Patent No.: US 12,052,900 B2
(45) Date of Patent: *Jul. 30, 2024

(54) DISPLAY PANEL AND DISPLAY APPARATUS INCLUDING THE SAME

(71) Applicant: Samsung Display Co., Ltd., Yongin-si (KR)

(72) Inventors: Sunghwan Kim, Yongin-si (KR); Wonkyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/006,028

(22) Filed: Aug. 28, 2020

(65) Prior Publication Data

US 2021/0193749 A1  Jun. 24, 2021

(30) Foreign Application Priority Data

Dec. 20, 2019 (KR) .................. 10-2019-0172240

(51) Int. Cl.
*H10K 59/35* (2023.01)
*H10K 59/12* (2023.01)
*H10K 59/65* (2023.01)

(52) U.S. Cl.
CPC ........... *H10K 59/352* (2023.02); *H10K 59/12* (2023.02); *H10K 59/351* (2023.02); *H10K 59/65* (2023.02)

(58) Field of Classification Search
CPC .... H01L 27/3211–3218; H01L 27/3216–3218; H10K 59/351–353
See application file for complete search history.

(56) References Cited

U.S. PATENT DOCUMENTS

| 8,247,966 B2 | 8/2012 | Lee et al. |
| 8,552,635 B2 | 10/2013 | Kim et al. |
| 8,872,797 B2 | 10/2014 | Lee et al. |

(Continued)

FOREIGN PATENT DOCUMENTS

| CN | 107194321 A | 9/2017 |
| CN | 108376696 A | 8/2018 |

(Continued)

OTHER PUBLICATIONS

EPO Extended European Search Report dated Jun. 17, 2021, issued in corresponding European Patent Application No. 20197263.5 (30 pages).

(Continued)

*Primary Examiner* — Eric K Ashbahian
(74) *Attorney, Agent, or Firm* — Lewis Roca Rothgerber Christie LLP

(57) ABSTRACT

A display panel and a display apparatus including the display panel are provided. A display panel includes: a substrate including a first region and a second region, the second region including a transmission portion; main pixels located in the first region, including a first main pixel, a second main pixel, and a third main pixel, and arranged in an RGBG pentile matrix structure; and auxiliary pixels located in the second region, including a first auxiliary pixel, a second auxiliary pixel, and a third auxiliary pixel, and arranged in an RBGB pentile matrix structure different from the RGBG pentile matrix structure of the main pixels.

18 Claims, 15 Drawing Sheets

(56) References Cited

U.S. PATENT DOCUMENTS

| | | | |
|---|---|---|---|
| 9,818,803 B2 | 11/2017 | Lee | |
| 2016/0254338 A1* | 9/2016 | Lin | H01L 29/78675 257/40 |
| 2017/0125506 A1* | 5/2017 | Kim | G09G 3/3225 |
| 2017/0221976 A1* | 8/2017 | Park | H10K 50/844 |
| 2017/0256747 A1* | 9/2017 | Lee | H01L 51/524 |
| 2018/0005561 A1 | 1/2018 | Moon et al. | |
| 2018/0089485 A1 | 3/2018 | Bok | |
| 2019/0115411 A1 | 4/2019 | Park et al. | |
| 2019/0212788 A1 | 7/2019 | Kwak et al. | |
| 2019/0237533 A1 | 8/2019 | Kim et al. | |
| 2019/0393286 A1 | 12/2019 | Ding et al. | |
| 2020/0019747 A1 | 1/2020 | Yang et al. | |
| 2020/0119107 A1 | 4/2020 | Liu et al. | |
| 2020/0133040 A1 | 4/2020 | Bang et al. | |
| 2020/0194730 A1 | 6/2020 | Park et al. | |
| 2020/0403043 A1 | 12/2020 | Xin et al. | |
| 2021/0041923 A1* | 2/2021 | Bai | H01L 27/3218 |
| 2021/0065625 A1* | 3/2021 | Wang | G09G 3/3266 |
| 2021/0074778 A1* | 3/2021 | Li | G02F 1/16766 |
| 2021/0141693 A1* | 5/2021 | Liu | G06F 11/1044 |
| 2021/0143231 A1* | 5/2021 | Chae | H01L 27/1255 |
| 2021/0151517 A1 | 5/2021 | Zhu | |
| 2021/0193033 A1 | 6/2021 | Tan et al. | |
| 2021/0193749 A1 | 6/2021 | Kim et al. | |
| 2021/0273197 A1* | 9/2021 | Wang | H01L 51/5225 |
| 2022/0278186 A1 | 9/2022 | Choi et al. | |
| 2022/0392963 A1 | 12/2022 | Chen et al. | |

FOREIGN PATENT DOCUMENTS

| | | | |
|---|---|---|---|
| CN | 108389879 A | 8/2018 | |
| CN | 108881530 A | 11/2018 | |
| CN | 109285868 A | 1/2019 | |
| CN | 208507679 U | 2/2019 | |
| CN | 208607570 U | 3/2019 | |
| CN | 110444125 A | 11/2019 | |
| EP | 3428967 A1 | 1/2019 | |
| EP | 3588367 A1 | 1/2020 | |
| KR | 10-1042955 B1 | 6/2011 | |
| KR | 10-2011-0129531 A | 12/2011 | |
| KR | 10-1158873 B1 | 6/2012 | |
| KR | 10-2015-0033968 A | 4/2015 | |
| KR | 10-1615332 B1 | 4/2016 | |
| KR | 10-2017-0024182 A | 3/2017 | |
| KR | 10-2017-0104097 | 9/2017 | |
| KR | 10-1859105 B1 | 5/2018 | |
| KR | 10-2020-0050059 | 5/2020 | |
| TW | 201939733 A | 10/2019 | |

OTHER PUBLICATIONS

EPO Partial European Search Report dated Feb. 23, 2021, issued in corresponding European Patent Application No. 20197263.5 (20 pages).

U.S. Office Action dated Mar. 28, 2022, issued in U.S. Appl. No. 17/075,094 (33 pages).

U.S. Advisory Action dated Mar. 8, 2023, issued in U.S. Appl. No. 17/075,094 (6 pages).

U.S. Final Office Action dated Dec. 12, 2022, issued in U.S. Appl. No. 17/075,094 (19 pages).

US Office Action dated Apr. 4, 2023, issued in U.S. Appl. No. 17/075,094 (20 pages).

US Final Office Action dated Oct. 17, 2023, issued in U.S. Appl. No. 17/075,094 (24 pages).

US Notice of Allowance dated Feb. 14, 2024, issued in U.S. Appl. No. 17/075,094 (10 pages).

* cited by examiner

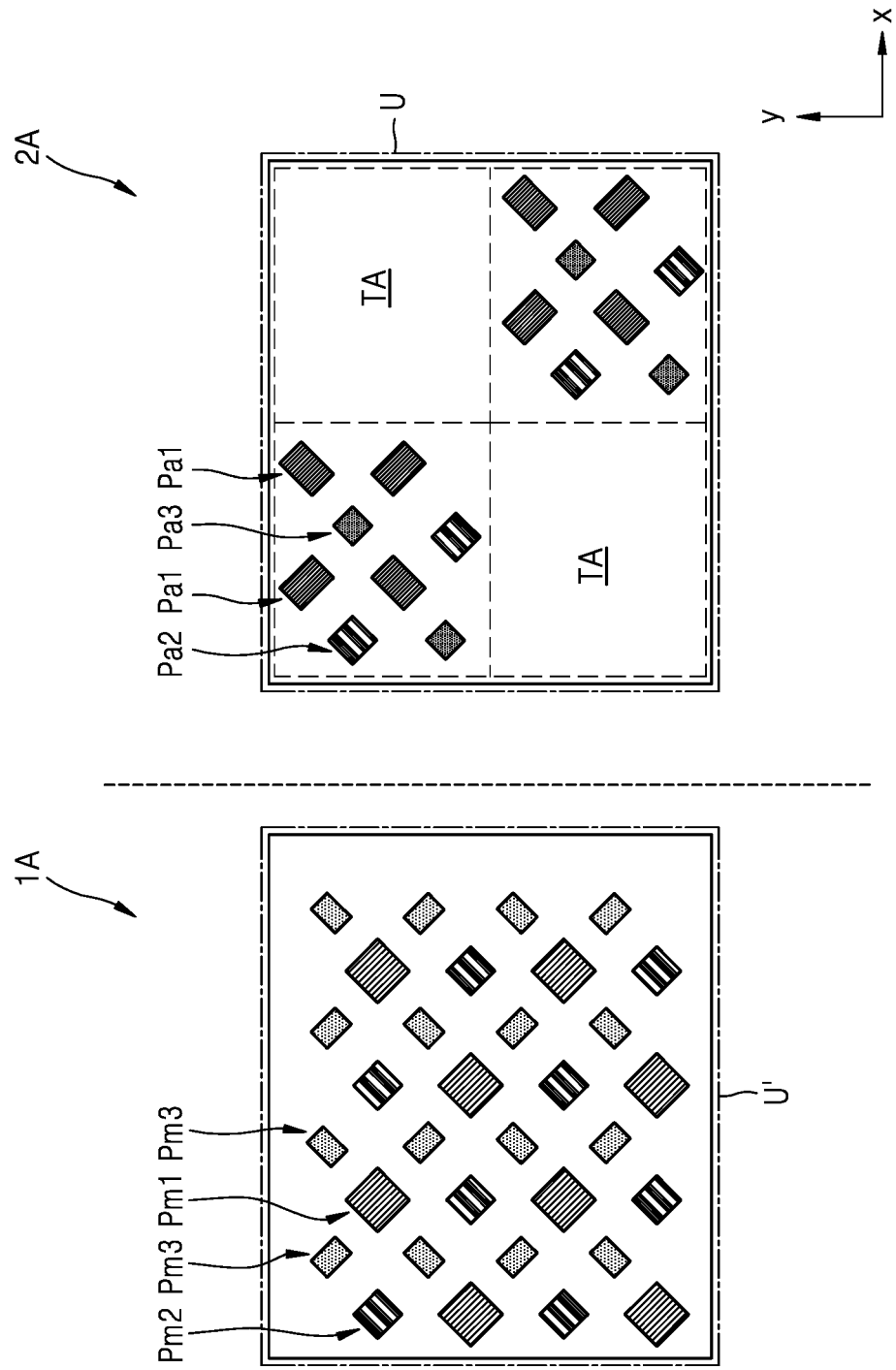

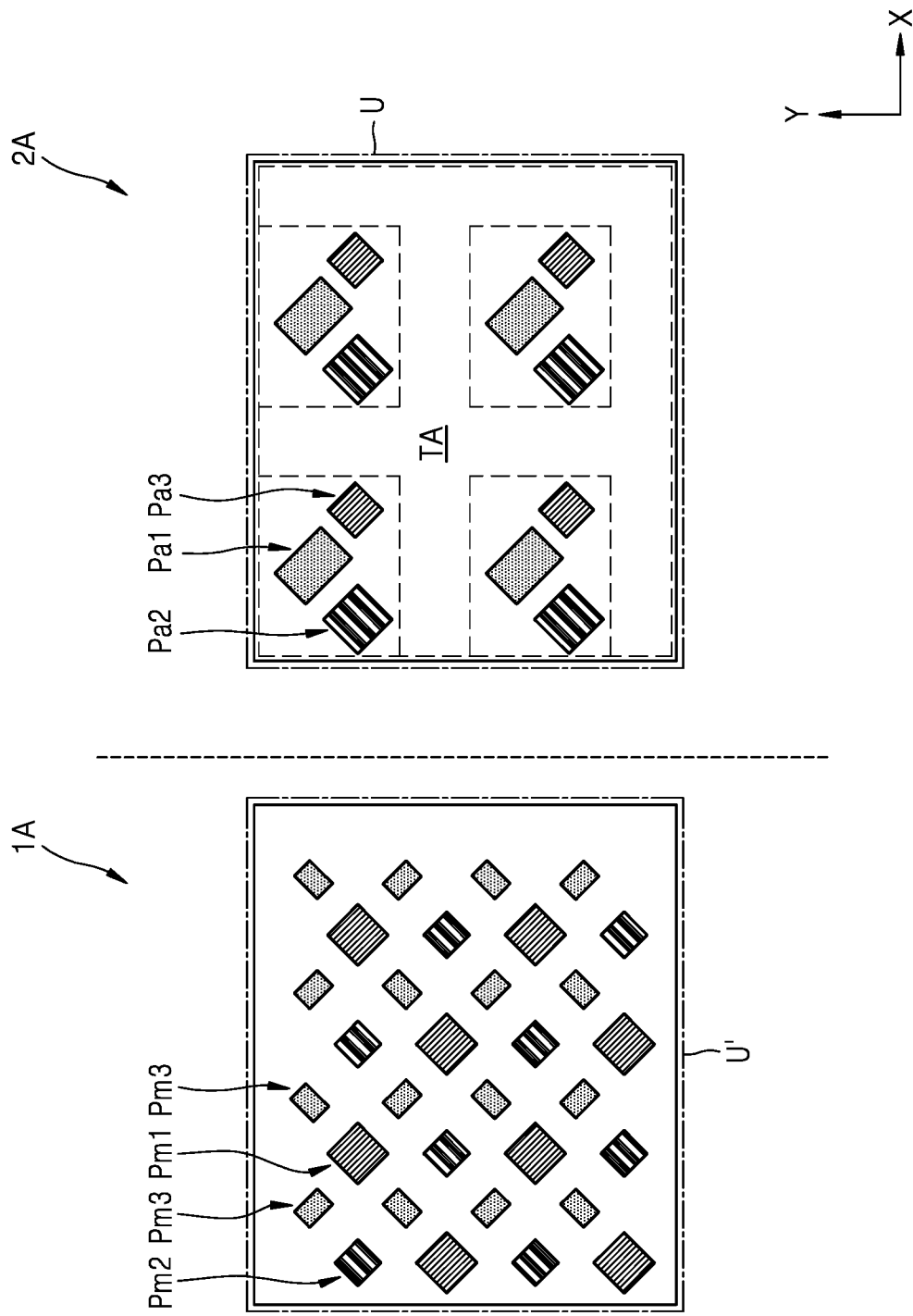

DISPLAY PANEL AND DISPLAY APPARATUS INCLUDING THE SAME

CROSS-REFERENCE TO RELATED APPLICATION

This application claims priority to and the benefit of Korean Patent Application No. 10-2019-0172240, filed on Dec. 20, 2019 in the Korean Intellectual Property Office, the entire disclosure of which is incorporated herein by reference.

BACKGROUND

1. Field

Aspects of one or more embodiments relate to a display panel and a display apparatus including the display panel.

2. Description of Related Art

Recently, the usage of display apparatuses has diversified. In addition, as thicknesses and weights of display apparatuses have decreased, the range of applications of display apparatuses has increased.

Due to the wide variety of uses of display apparatuses, shapes of the display apparatuses may be designed in various ways, and various functions linked to or associated with the display apparatuses have increased.

SUMMARY

According to aspects of embodiments of the present disclosure, a display panel in which a display area extends such that an image may be displayed even in an area where a component is located, and a display apparatus including the display panel, are provided. According to another aspect of one or more embodiments of the present disclosure, to increase a function linked to or associated with a display apparatus, a display apparatus includes an area where a component, such as a sensor or a camera, may be located inside a display area. However, the above aspects are provided as examples, and do not limit the scope of the present disclosure.

Additional aspects will be set forth, in part, in the description which follows and, in part, will be apparent from the description, or may be learned by practice of the presented embodiments of the disclosure.

According to one or more embodiments, a display panel includes: a substrate including a first region and a second region including a transmission portion; main pixels located in the first region, including a first main pixel, a second main pixel, and a third main pixel, and arranged in an RGBG pentile matrix structure; and auxiliary pixels located in the second region, including a first auxiliary pixel, a second auxiliary pixel, and a third auxiliary pixel, and arranged in an RBGB pentile matrix structure different from the RGBG pentile matrix structure of the main pixels, wherein the first auxiliary pixel includes a first auxiliary emission area, and the first main pixel, which emits light having a same wavelength as the first auxiliary pixel, includes a first main emission area, and the first auxiliary emission area has a first area, and the first main emission area has a second area smaller than the first area.

The first area may be 1.4 to 1.8 times that of the second area.

The second auxiliary pixel may include a second auxiliary emission area, and the second main pixel, which emits light having a same wavelength as the second auxiliary pixel, may include a second main emission area, and the second auxiliary emission area may have a third area, and the second main emission area may have a fourth area smaller than the third area.

The third area may be 1.4 to 1.8 times that of the fourth area.

The third auxiliary pixel may include a third auxiliary emission area, and the third main pixel, which emits light having a same wavelength as the third auxiliary pixel, may include a third main emission area, and the third auxiliary emission area may have a fifth area, and the third main emission area may have a sixth area smaller than the fifth area.

The fifth area may be 1.4 to 1.8 times that of the sixth area.

The first auxiliary pixel and the first main pixel may emit light having a blue wavelength, the second auxiliary pixel and the second main pixel may emit light having a red wavelength, and the third auxiliary pixel and the third main pixel may emit light having a green wavelength.

The RGBG pentile matrix structure may include one first main pixel, one second main pixel, and two third main pixels.

The RBGB pentile matrix structure may include two first auxiliary pixels, one second auxiliary pixel, and one third auxiliary pixel.

A basic unit including the auxiliary pixels and the transmission portion may be repeatedly arranged in the second region.

The display panel may further include an inorganic insulating layer located on the substrate, wherein the inorganic insulating layer includes an opening corresponding to the transmission portion.

The display panel may further include an organic insulating layer located on the substrate, wherein the organic insulating layer includes an opening corresponding to the transmission portion.

The display panel may further include an opposite electrode integrally formed with the main pixels and the auxiliary pixels, the opposite electrode located in the first region and the second region and including an opening corresponding to the transmission portion.

At least a part of the second region may be surrounded by the first region.

According to one or more embodiments, a display apparatus includes: a display panel including a substrate including a first region and a second region that includes a transmission portion; and a component located to correspond to the second region of the display panel, wherein the display panel includes: main pixels located in the first region, including a first main pixel, a second main pixel, and a third main pixel, and arranged in an RGBG pentile matrix structure; and auxiliary pixels located in the second region, including a first auxiliary pixel, a second auxiliary pixel, and a third auxiliary pixel, and arranged in an RBGB pentile matrix structure different from the RGBG pentile matrix structure of the main pixels, and the first auxiliary pixel includes a first auxiliary emission area, and the first main pixel, which emits light having a same wavelength as the first auxiliary pixel, includes a first main emission area, and the first auxiliary emission area has a first area, and the first main emission area has a second area equal to or smaller than the first area.

The first area may be 1 to 1.8 times that of the second area.

The first auxiliary pixel and the first main pixel may emit light having a blue wavelength, the second auxiliary pixel and the second main pixel may emit light having a red wavelength, and the third auxiliary pixel and the third main pixel may emit light having a green wavelength.

The RGBG pentile matrix structure may include one first main pixel, one second main pixel, and two third main pixels.

The RBGB pentile matrix structure may include two first auxiliary pixels, one second auxiliary pixel, and one third auxiliary pixel.

The component may include an imaging device.

Other aspects, features, and advantages will become apparent and more readily appreciated from the following description of some embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 11A and 11B are plan views illustrating an arrangement of pixels and a transmission portion located in a first region and a second region, according to some embodiments of the present disclosure; and FIGS. 12A and 12B are plan views illustrating an arrangement of pixels and a transmission portion located in a first region and a second region, according to some embodiments of the present disclosure.

DETAILED DESCRIPTION

Figure 1:
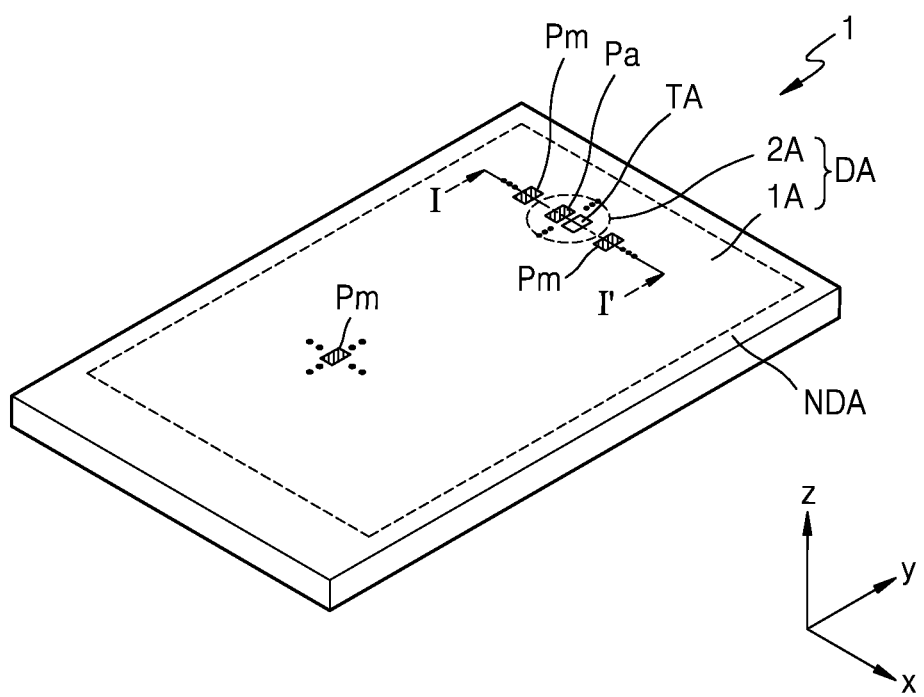
FIG. 1 is a perspective view of a display apparatus according to an embodiment of the present disclosure.

Reference will now be made in further detail to embodiments, some examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Reference will now be made in further detail to embodiments, some examples of which are illustrated in the accompanying drawings, and, in the drawings, the same elements are denoted by the same reference numerals and a repeated description thereof may not be given.

It is to be understood that although the terms "first," "second," etc. may be used herein to describe various elements, these elements should not be limited by these terms and are used to distinguish one element from another. As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components. It is to be understood that when a layer, region, or element is referred to as being "formed on" or "connected to" another layer, region, or element, it may be directly formed on or connected to the other layer, region, or element, or one or more intervening layers, regions, or elements may be present therebetween.

Sizes of elements may be exaggerated or contracted for convenience of explanation. For example, because sizes and thicknesses of elements in the drawings may be arbitrarily illustrated for convenience of explanation, the following embodiments of the present disclosure are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment of the present disclosure may be implemented differently, a specific process order may be different from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display apparatus according to an embodiment of the present disclosure.

Referring to FIG. 1, a display apparatus 1 includes a display area DA where an image is formed and a non-display area NDA where an image is not formed. The display area DA includes a first region 1A, and a second region 2A including a transmission portion TA. The display apparatus 1 may provide a main image by using light emitted by a plurality of main pixels Pm located in the first region 1A, and may provide an auxiliary image by using light emitted by a plurality of auxiliary pixels Pa located in the second region 2A.

The second region 2A may be a region under which a component including an imaging device, or the like, is located, as described below with reference to FIG. 2. The second region 2A may include the transmission portion TA through which light and/or sound output from the component to the outside or traveling from the outside toward the component may be transmitted. According to an embodiment of the present disclosure, when infrared rays are transmitted through the second region 2A, a light transmittance may be equal to or greater than about 30%, and, in an embodiment, equal to or greater than 50%, 75%, 80%, 85% or 90%.

In the present embodiment, the plurality of auxiliary pixels Pa may be located in the second region 2A, and a certain image may be provided by using light emitted by the plurality of auxiliary pixels Pa. An image provided in the second region 2A may be an auxiliary image and may have a resolution lower than that of an image provided in the first region 1A. That is, because the second region 2A includes the transmission portion TA through which light and/or sound may be transmitted, the number of auxiliary pixels Pa that may be located per unit area may be less than the number of main pixels Pm located per unit area in the first region 1A.

Although an organic light-emitting display apparatus will be described as the display apparatus 1 according to an embodiment of the present disclosure, the display apparatus 1 of the present disclosure is not limited thereto. In an embodiment, the display apparatus 1 of the present disclosure may be any of various display apparatuses, such as an inorganic electroluminescent (EL) display or a quantum dot light-emitting display.

Although the second region 2A is shown located on an upper portion of the display area DA and having a quadrangular shape in FIG. 1, the present disclosure is not limited thereto. For example, a shape of the display area DA may be a circular shape, an elliptical shape, or a polygonal shape, such as a triangular shape, and locations and the number of the second regions 2A may be changed in various ways.

Figure 2:
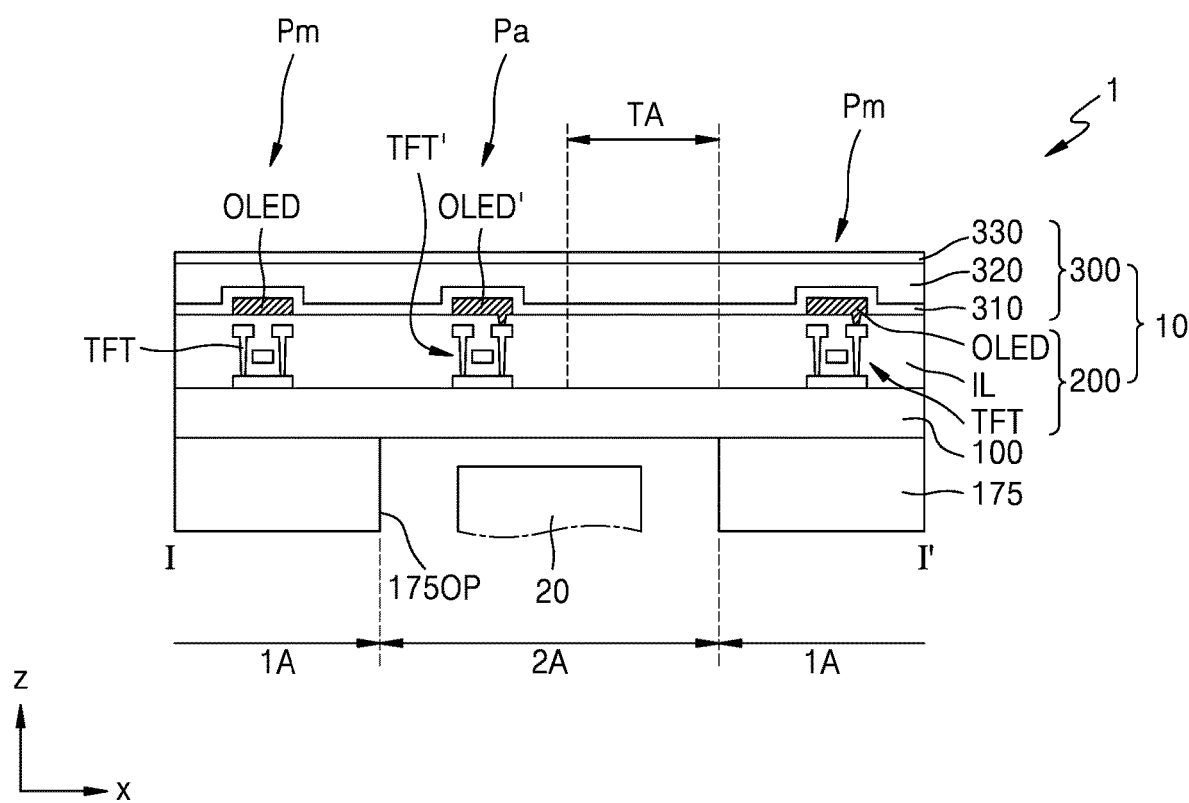
FIG. 2 is a cross-sectional view of the display apparatus of FIG. 1, taken along the line I-I'.

FIG. 2 is a cross-sectional view of the display apparatus 1, taken along the line I-I' of FIG. 1.

Referring to FIG. 2, the display apparatus 1 may include a display panel 10 including a display element, and a component 20 located under the display panel 10 and corresponding to the second region 2A.

The display panel 10 may include a substrate 100, a display element layer 200 located on the substrate 100, and a thin-film encapsulation layer 300 that is a sealing member for sealing the display element layer 200. In an embodiment, the display panel 10 may further include a lower protective film 175 located under the substrate 100.

The substrate 100 may include glass or a polymer resin. In an embodiment, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. In an embodiment, the substrate 100 may have a multi-layer structure including a layer including the polymer resin and an inorganic layer (not shown).

The display element layer 200 may include a circuit layer including a main thin-film transistor TFT and an auxiliary thin-film transistor TFT', a main organic light-emitting diode OLED and an auxiliary organic light-emitting diode OLED' that are display elements, and an insulating layer IL between the circuit layer and the main and auxiliary organic light-emitting diodes OLED and OLED'. The main pixel Pm including the main thin-film transistor TFT and the main organic light-emitting diode OLED connected to the main thin-film transistor TFT may be located in the first region 1A, and the auxiliary pixel Pa including the auxiliary thin-film transistor TFT' and the auxiliary organic light-emitting diode OLED' connected to the auxiliary thin-film transistor TFT' may be located in the second region 2A.

Also, the auxiliary thin-film transistor TFT' and the transmission portion TA where a display element is not located may be located in the second region 2A. The transmission portion TA may be a portion through which light/a signal emitted from the component 20 or light/a signal incident on the component 20 is transmitted.

Referring to FIG. 2, the display element layer 200 may be covered by the thin-film encapsulation layer 300. In an embodiment, the thin-film encapsulation layer 300 may include at least one inorganic encapsulation layer and at least one organic encapsulation layer. FIG. 2 illustrates, in an embodiment, a first inorganic encapsulation layer 310 and a second inorganic encapsulation layer 330, and an organic encapsulation layer 320 located between the first inorganic encapsulation layer 310 and the second inorganic encapsulation layer 330.

In an embodiment, each of the first and second inorganic encapsulation layers 310 and 330 may include at least one inorganic insulating material from among aluminum oxide, titanium oxide, tantalum oxide, hafnium oxide, zinc oxide, silicon oxide, silicon nitride, and silicon oxynitride. The organic encapsulation layer 320 may include a polymer-based material. In an embodiment, the polymer-based material may include any of an acrylic resin, an epoxy resin, polyimide, and polyethylene.

In an embodiment, the lower protective film 175 may be attached to the bottom of the substrate 100 and may support and protect the substrate 100. The lower protective film 175 may have an opening 175OP corresponding to the second region 2A. In an embodiment, because the opening 175OP is formed in the lower protective film 175, a light transmittance of the second region 2A may be increased. In an embodiment, the lower protective film 175 may include polyethylene terephthalate or polyimide.

The area of the second region 2A may be greater than the area of a region where the component 20 is located. Accordingly, the area of the opening 175OP of the lower protective film 175 may not be the same as the area of the second region 2A. For example, the area of the opening 175OP may be less than the area of the second region 2A.

Also, a plurality of the components 20 may be located in the second region 2A. The plurality of components 20 may have different functions.

Figure 3A:
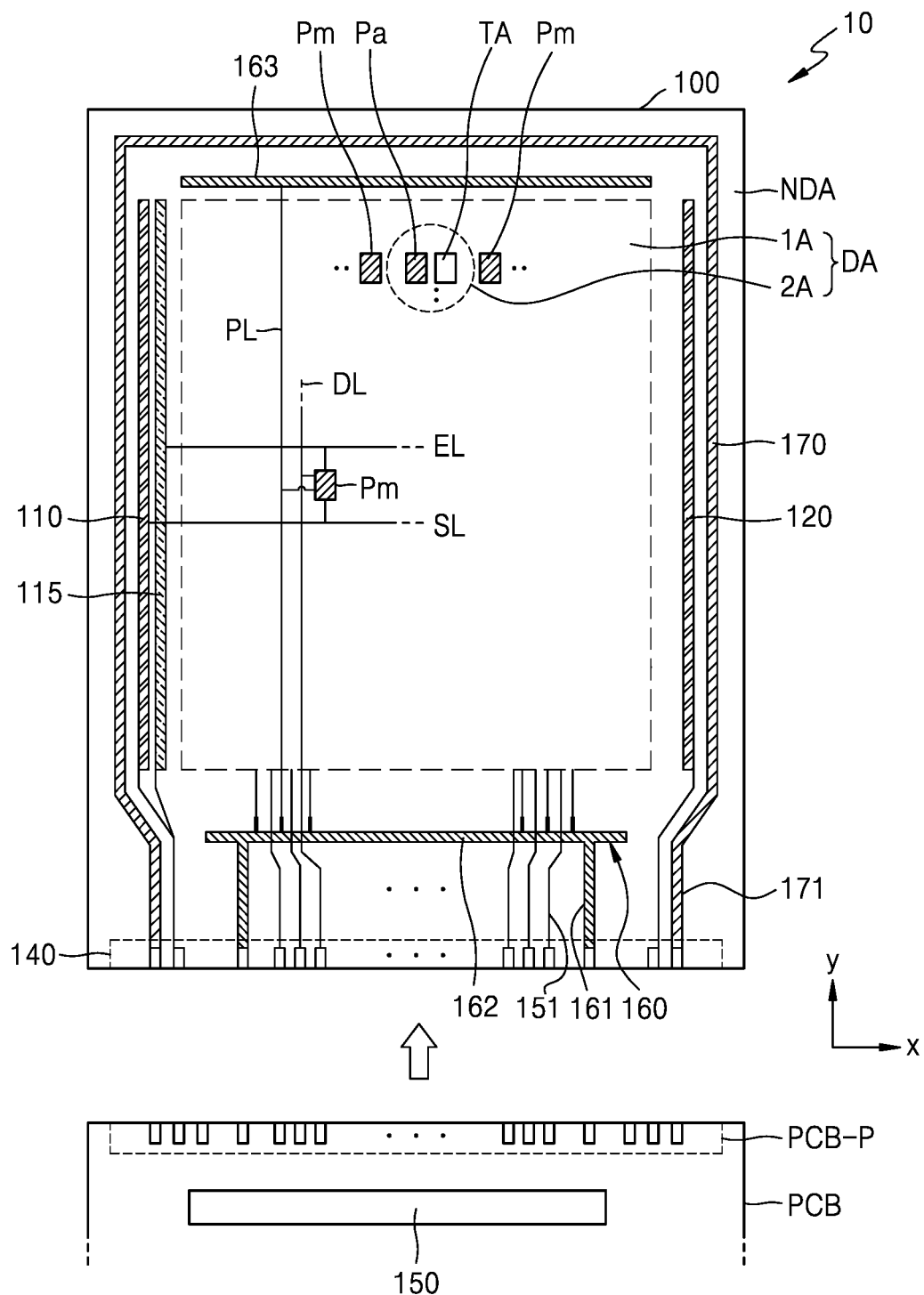
FIGS. 3A and 3B are plan views of a display panel according to some embodiments of the present disclosure.
Figure 3B:
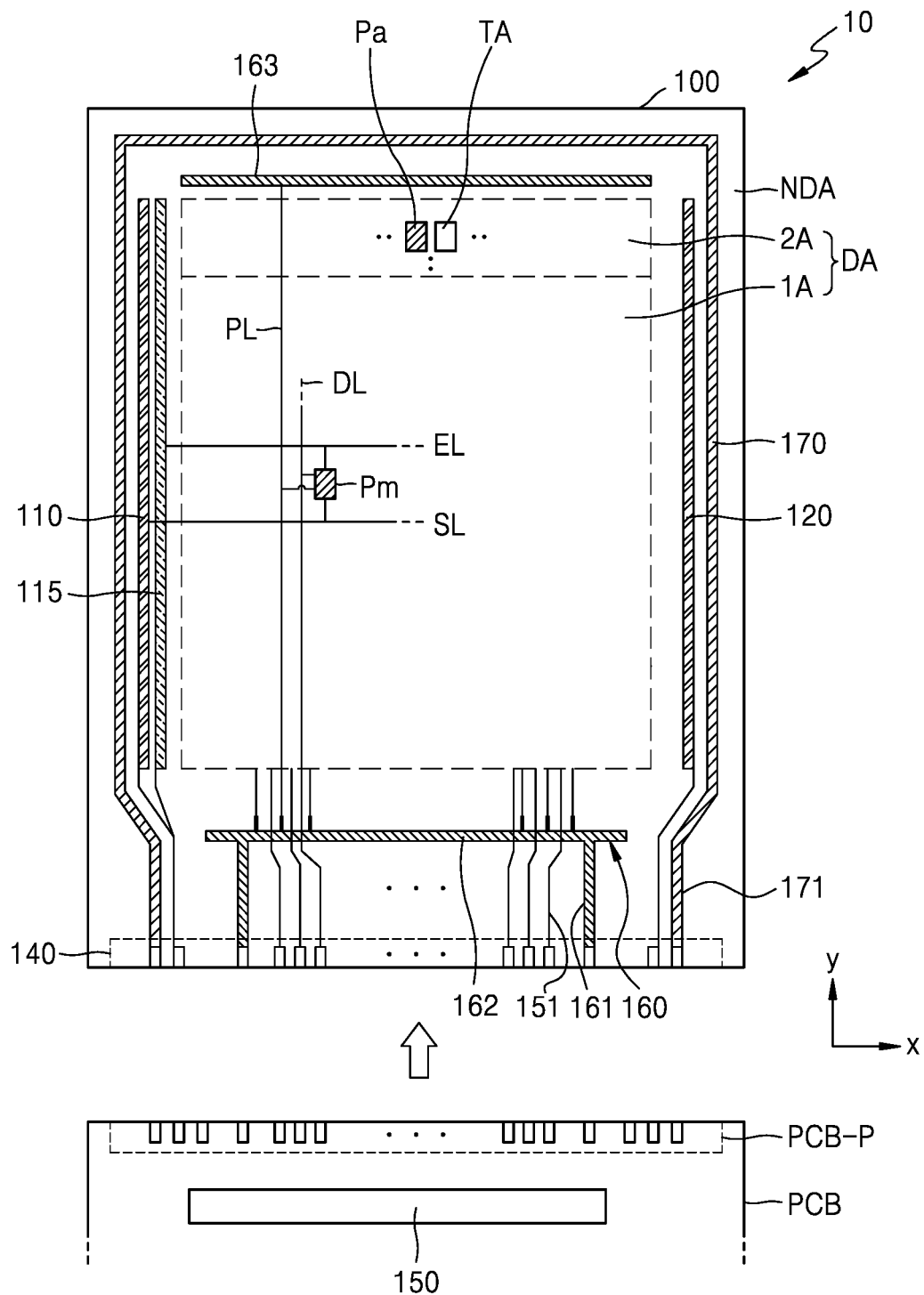

FIGS. 3A and 3B are plan views of a display panel according to some embodiments of the present disclosure.

Referring to FIG. 3A, various elements of the display panel 10 are located on the substrate 100. The substrate 100 includes the display area DA and the non-display area NDA around (e.g., surrounding) the display area DA. The display area DA includes the first region 1A and the second region 2A including the transmission portion TA. The display area DA may be covered by an encapsulation member described with reference to FIG. 2 to be protected from external air or moisture.

The display panel 10 includes the main pixels Pm located in the first region 1A. Each of the main pixels Pm may include a display element, such as an organic light-emitting diode. Each main pixel Pm may emit light, for example, red, green, blue, or white light, from the organic light-emitting diode. The main pixel Pm used herein may refer to a pixel that emits light of one color from among red light, green light, blue light, and white light as described above.

The second region 2A may be located at a side of the first region 1A, and the plurality of auxiliary pixels Pa are located in the second region 2A. Each of the auxiliary pixels Pa may include a display element, such as an organic light-emitting diode. Each auxiliary pixel Pa may emit light, for example, red, green, blue, or white light, from the organic light-emitting diode. The auxiliary pixel Pa used herein may refer to a pixel that emits light of one color from among red light, green light, blue light, and white light as described above. The transmission portion TA located between the auxiliary pixels Pa may be provided in the second region 2A. At least one component 20 located under the second region 2A of the display apparatus 1 may correspond to the second region 2A.

In an embodiment, one main pixel Pm and one auxiliary pixel Pa may include the same pixel circuit. However, the present disclosure is not limited thereto. In another embodiment, a pixel circuit included in the main pixel Pm and a pixel circuit included in the auxiliary pixel Pa may be different from each other.

The main and auxiliary pixels Pm and Pa may be electrically connected to outer circuits located in the non-display area NDA. In an embodiment, a first scan driving circuit 110, a first emission driving circuit 115, a second scan driving circuit 120, a terminal 140, a data driving circuit 150, a first power supply wiring 160, and a second power supply wiring 170 may be located in the non-display area NDA.

The first scan driving circuit 110 may apply a scan signal to each of the main and auxiliary pixels Pm and Pa through a scan line SL. The first emission driving circuit 115 may apply an emission control signal to each pixel through an emission control line EL. The second scan driving circuit 120 may be parallel to the first scan driving circuit 110 with the display area DA therebetween. Some of the main and auxiliary pixels Pm and Pa located in the display area DA may be electrically connected to the first scan driving circuit 110, and the others may be connected to the second scan driving circuit 120. In an embodiment, a second emission driving circuit (not shown) may be located parallel to the first emission driving circuit 115 with the display area DA therebetween.

The first emission driving circuit 115 may be located in the non-display area NDA to be spaced apart from the first scan driving circuit 110 in an x-direction. In an embodiment, the first emission driving circuit 115 and the first scan driving circuit 110 may be alternately located in a y-direction.

The terminal 140 may be located at a side of the substrate 100. The terminal 140 may be exposed by not being covered by an insulating layer and may be electrically connected to a printed circuit board PCB. A terminal PCB-P of the printed circuit board PCB may be electrically connected to the terminal 140 of the display panel 10. The printed circuit board PCB transmits a signal or power of a controller (not shown) to the display apparatus 1. A control signal generated by the controller may be transmitted to the first and second scan driving circuits 110 and 120 and the first emission driving circuit 115 through the printed circuit board PCB. The controller may supply a first power supply voltage ELVDD and a second power supply voltage ELVSS respectively to the first and second power supply wirings 160 and 170 through first and second connection wirings 161 and 171. The first power supply voltage ELVDD may be supplied to each of the main and auxiliary pixels Pm and Pa through a driving voltage line PL connected to the first power supply wiring 160, and the second power supply voltage ELVSS may be supplied to an opposite electrode of each of the main and auxiliary pixels Pm and Pa connected to the second power supply wiring 170.

The data driving circuit 150 is electrically connected to a data line DL. A data signal of the data driving circuit 150 may be applied to each of the main and auxiliary pixels Pm and Pa through a connection wiring 151 connected to the terminal 140 and the data line DL connected to the connection wiring 151. Although the data driving circuit 150 is shown located on the printed circuit board PCB in FIG. 3A, in another embodiment, the data driving circuit 150 may be located on the substrate 100. For example, the data driving circuit 150 may be located between the terminal 140 and the first power supply wiring 160.

In an embodiment, the first power supply wiring 160 may include a first sub-wiring 162 and a second sub-wiring 163 extending in the x-direction to be parallel to each other with the display area DA therebetween. In an embodiment, the second power supply wiring 170 may partially surround the display area DA in a loop shape having one open side.

Referring to FIG. 3A, the second region 2A including the transmission portion TA may be located inside the first region 1A and may be surrounded by the first region 1A, and referring to FIG. 3B, the second region 2A may be located at a side of the first region 1A. However, the present disclosure is not limited thereto.

Figure 4:
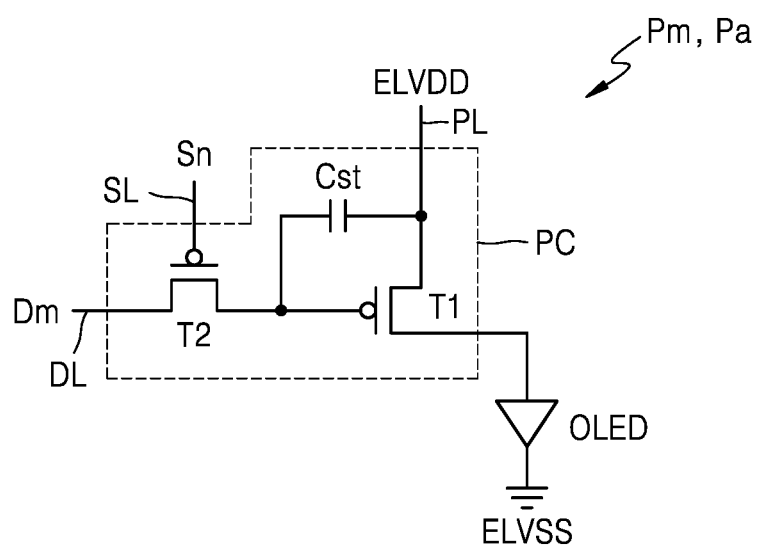
FIGS. 4 and 5 are equivalent circuit diagrams of a main pixel and/or an auxiliary pixel that may be included in a display panel according to some embodiments of the present disclosure.
Figure 5:
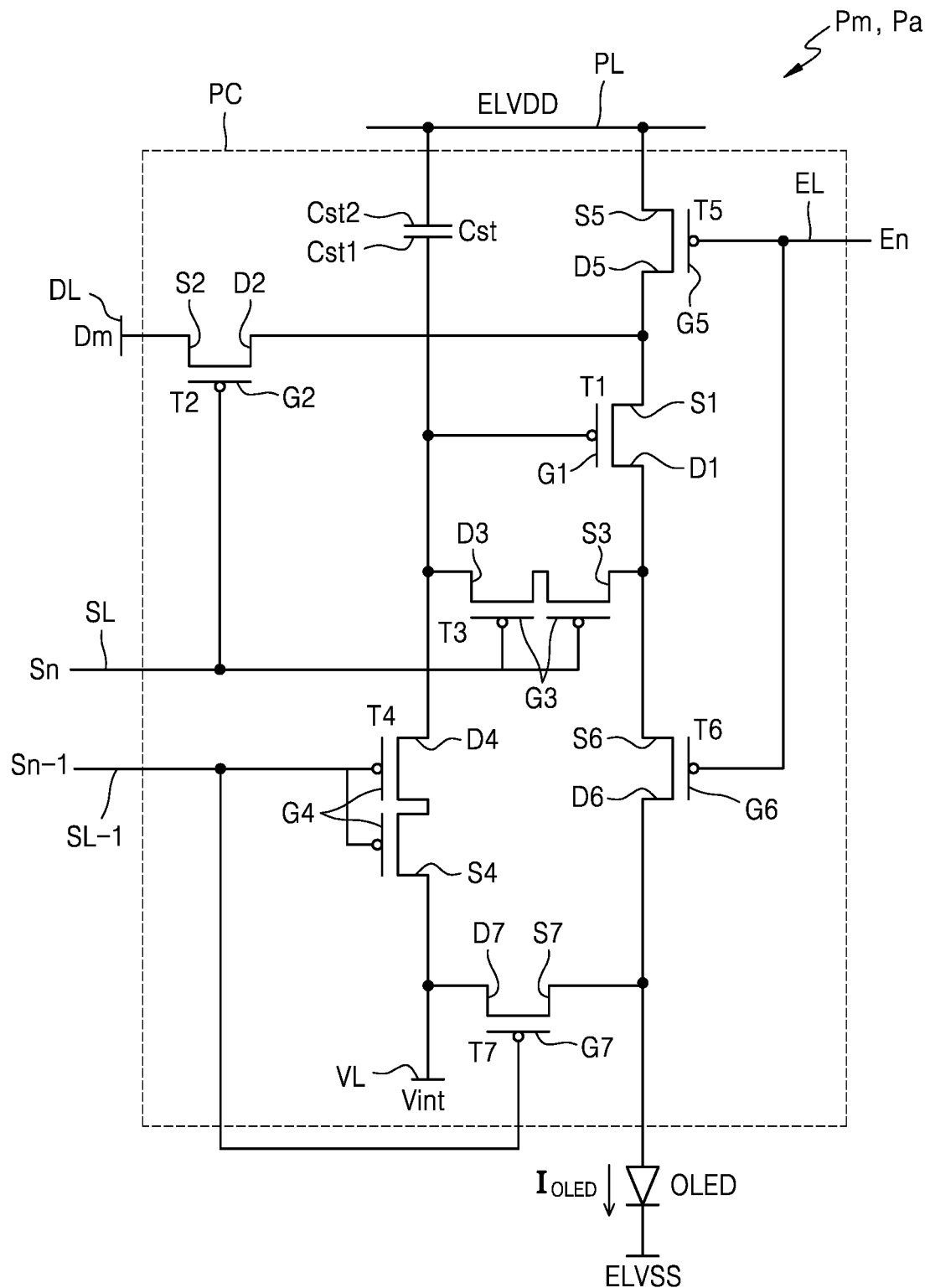

FIGS. 4 and 5 are equivalent circuit diagrams of a main pixel and/or an auxiliary pixel that may be included in a display panel according to some embodiments of the present disclosure.

Referring to FIG. 4, in an embodiment, each of the main and auxiliary pixels Pm and Pa includes a pixel circuit PC connected to the scan line SL and the data line DL and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL, and transmits a data signal Dm input through the data line DL according to a scan signal Sn input through the scan line SL to the driving thin-film transistor T1.

The storage capacitor Cst is connected to the switching thin-film transistor T2 and the driving voltage line PL, and stores a voltage corresponding to a difference between a voltage received from the switching thin-film transistor T2 and the first power supply voltage ELVDD (or a driving voltage) supplied to the driving voltage line PL.

The driving thin-film transistor T1 may be connected to the driving voltage line PL and the storage capacitor Cst, and may control driving current flowing through the organic light-emitting diode OLED from the driving voltage line PL in response to the value of a voltage stored in the storage capacitor Cst. The organic light-emitting diode OLED may emit light having a certain luminance according to the driving current.

Although the pixel circuit PC includes two thin-film transistors and one storage capacitor in FIG. 4, the present disclosure is not limited thereto. For example, as shown in FIG. 5, the pixel circuit PC may include seven thin-film transistors and one storage capacitor.

Referring to FIG. 5, each of the main and auxiliary pixels Pm and Pa includes the pixel circuit PC and the organic light-emitting diode OLED connected to the pixel circuit PC. The pixel circuit PC may include a plurality of thin-film transistors and a storage capacitor. The thin-film transistors and the storage capacitor may be connected to signal lines (e.g., the scan line SL, a previous scan line SL-1, the emission control line EL, and the data line DL), an initialization voltage line VL, and the driving voltage line PL.

Although the main and auxiliary pixels Pm and Pa are connected to the signal lines (e.g., the scan line SL, the previous scan line SL-1, the emission control line EL, and the data line DL), the initialization voltage line VL, and the driving voltage line PL in FIG. 5, the present disclosure is not limited thereto. In an embodiment, at least one of the signal lines (e.g., the scan line SL, the previous scan line SL-1, the emission control line EL, and the data line DL), the initialization voltage line VL, and the driving voltage line PL may be shared by neighboring pixels.

The plurality of thin-film transistors may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines include the scan line SL that transmits the scan signal Sn, the previous scan line SL-1 that transmits a previous scan signal Sn-1 to the first initialization thin-film transistor T4 and the second initialization thin-film transistor T7, the emission control line EL that transmits an emission control signal En to the operation control thin-film transistor T5 and the emission control thin-film transistor T6, and the data line DL that intersects the scan line SL and transmits the data signal Dm. The driving voltage line PL transmits the driving voltage ELVDD to the driving thin-film transistor T1, and the initialization voltage line VL transmits an initialization voltage Vint that initializes a pixel electrode and the driving thin-film transistor T1.

A driving gate electrode G1 of the driving thin-film transistor T1 is connected to a storage capacitor plate Cst1 of the storage capacitor Cst, a driving source electrode S1 of the driving thin-film transistor T1 is connected to the driving voltage line PL via the operation control thin-film transistor T5, and a driving drain electrode D1 of the driving thin-film transistor T1 is electrically connected to a pixel electrode of the organic light-emitting diode OLED via the emission control thin-film transistor T6. The driving thin-film transistor T1 receives the data signal Dm and supplies a driving current IDLED to the organic light-emitting diode OLED according to a switching operation of the switching thin-film transistor T2.

A switching gate electrode G2 of the switching thin-film transistor T2 is connected to the scan line SL, a switching source electrode S2 of the switching thin-film transistor T2 is connected to the data line DL, and a switching drain electrode D2 of the switching thin-film transistor T2 is connected to the driving source electrode S1 of the driving thin-film transistor T1 and is connected to the driving voltage line PL via the operation control thin-film transistor T5. The switching thin-film transistor T2 is turned on according to the scan signal Sn received through the scan line SL and performs a switching operation of transmitting the data signal Dm through the data line DL to the driving source electrode S1 of the driving thin-film transistor T1.

A compensation gate electrode G3 of the compensation thin-film transistor T3 is connected to the scan line SL, a compensation source electrode S3 of the compensation thin-film transistor T3 is connected to the driving drain electrode D1 of the driving thin-film transistor T1 and is connected to the pixel electrode of the organic light-emitting diode OLED via the emission control thin-film transistor T6, and a compensation drain electrode D3 of the compensation thin-film transistor T3 is connected to the first storage capacitor plate Cst1 of the storage capacitor Cst, a first initialization drain electrode D4 of the first initialization thin-film transistor T4, and the driving gate electrode G1 of the driving thin-film transistor T1. The compensation thin-film transistor T3 is turned on according to the scan signal Sn received through the scan line SL, and diode-connects the driving thin-film transistor T1 by electrically connecting the driving gate electrode G1 to the driving drain electrode D1 of the driving thin-film transistor T1.

A first initialization gate electrode G4 of the first initialization thin-film transistor T4 is connected to the previous scan line SL-1, a first initialization source electrode S4 of the first initialization thin-film transistor T4 is connected to a second initialization drain electrode D7 of the second initialization thin-film transistor T7 and the initialization voltage line VL, and the first initialization drain electrode D4 of the first initialization thin-film transistor T4 is connected to the first storage capacitor plate Cst1 of the storage capacitor Cst, the compensation drain electrode D3 of the compensation thin-film transistor T3, and the driving gate electrode G1 of the driving thin-film transistor T1. The first initialization thin-film transistor T4 is turned on according to the previous scan signal Sn-1 received through the previous scan line SL-1 and performs an initialization operation of initializing a voltage of the driving gate electrode G1 of the driving thin-film transistor T1 by transmitting the initialization voltage Vint to the driving gate electrode G1 of the driving thin-film transistor T1.

An operation control gate electrode G5 of the operation control thin-film transistor T5 is connected to the emission control line EL, an operation control source electrode S5 of the operation control thin-film transistor T5 is connected to the lower driving voltage line PL, and an operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the emission control thin-film transistor T6 is connected to the emission control line EL, an emission control source electrode S6 of the emission control thin-film transistor T6 is connected to the driving drain electrode D1 of the driving thin-film transistor T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting diode OLED.

The operation control thin-film transistor T5 and the emission control thin-film transistor T6 are concurrently (e.g., simultaneously) turned on according to the emission control signal En received through the emission control line EL, and cause the driving voltage ELVDD to be transmitted to the organic light-emitting diode OLED and the driving current IDLED to flow through the organic light-emitting diode OLED.

A second initialization gate electrode G7 of the second initialization thin-film transistor T7 is connected to the previous scan line SL-1, the second initialization source electrode S7 of the second initialization thin-film transistor T7 is connected to the emission control drain electrode D6 of the emission control thin-film transistor T6 and the pixel electrode of the organic light-emitting diode OLED, and the second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on according to the previous scan signal Sn-1 received through the previous scan line SL-1 and initializes the pixel electrode of the organic light-emitting diode OLED.

Although the first initialization thin-film transistor T4 and the second initialization thin-film transistor T7 are shown connected to the previous scan line SL-1 in FIG. 5, the present disclosure is not limited thereto. In an embodiment, the first initialization thin-film transistor T4 may be connected to the previous scan line SL-1 and may operate according to the previous scan signal Sn-1, and the second initialization thin-film transistor T7 may be connected to a separate signal line (e.g., a next scan line) and may operate according to a signal transmitted through the signal line.

A second storage capacitor plate Cst2 of the storage capacitor Cst is connected to the driving voltage line PL, and an opposite electrode of the organic light-emitting diode OLED is connected to a common voltage ELVSS. Accordingly, the organic light-emitting diode OLED may receive the driving current $I_{OLED}$ from the driving thin-film transistor T1 to emit light and display an image.

Although the compensation thin-film transistor T3 and the first initialization thin-film transistor T4 are shown to have dual gate electrodes in FIG. 5, the compensation thin-film transistor T3 and the first initialization thin-film transistor T4 may include one gate electrode.

In the present embodiment, the main pixel Pm and the auxiliary pixel Pa may include the same pixel circuit PC. However, the present disclosure is not limited thereto. In an embodiment, the main pixel Pm and the auxiliary pixel Pa may have pixel circuits PC having different structures, and various modifications may be made. For example, the main pixel Pm may include a pixel circuit of FIG. 5, and the auxiliary pixel Pa may include a pixel circuit of FIG. 4.

Figure 6:
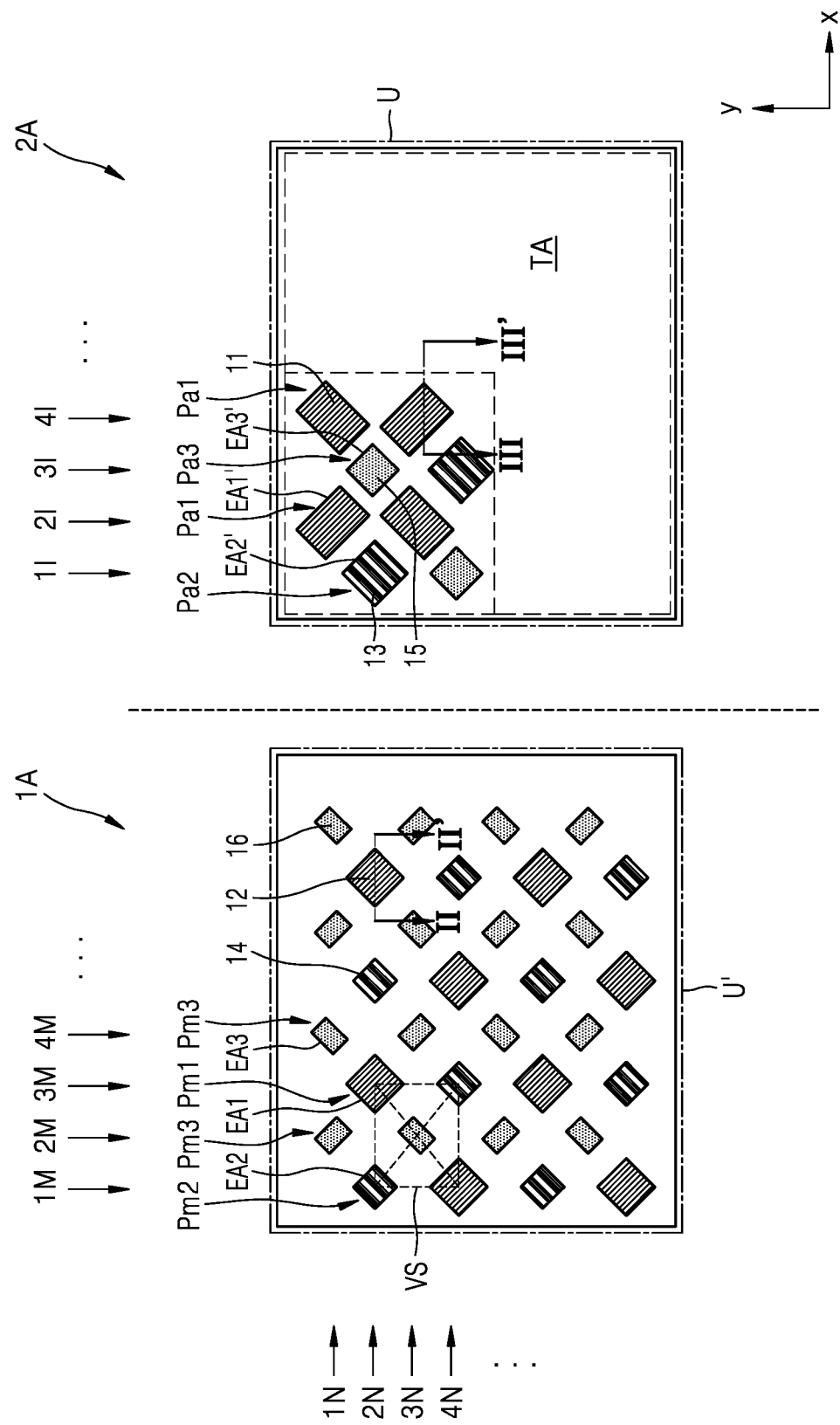
FIGS. 6 and 7 are plan views illustrating an arrangement of pixels and a transmission portion located in a first region and a second region in a display apparatus, according to some embodiments of the present disclosure.
Figure 7:
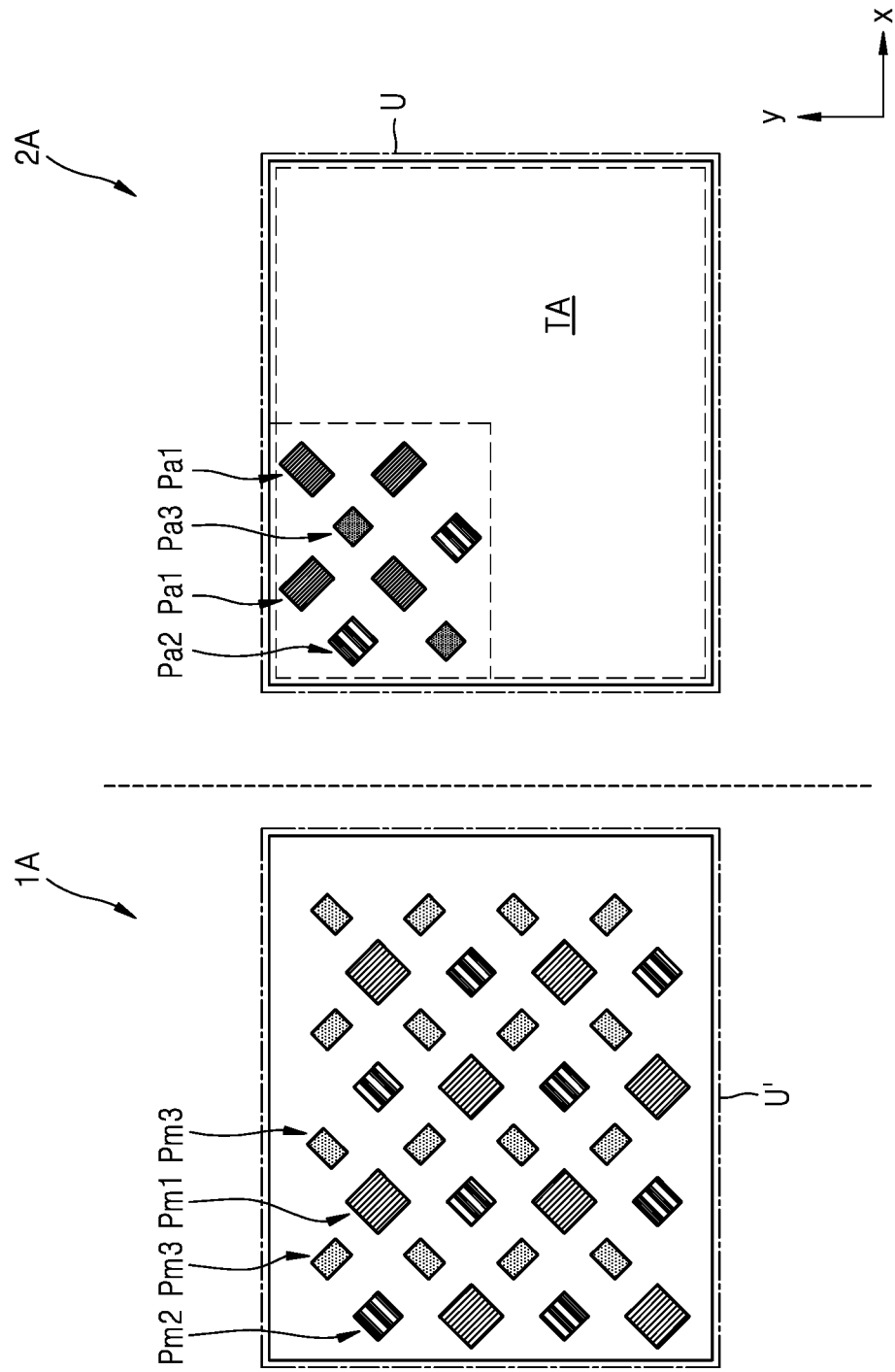

FIGS. 6 and 7 are plan views illustrating an arrangement of pixels and a transmission portion located in a first region and a second region in a display apparatus, according to some embodiments of the present disclosure.

Referring to FIG. 6, first through third main pixels Pm1, Pm2, and Pm3 are located in the first region 1A of the display apparatus, and first through third auxiliary pixels Pa1, Pa2, and Pa3 are located in the second region 2A including the transmission portion TA, according to an embodiment of the present disclosure.

In the present embodiment, the first through third main pixels Pm1, Pm2, and Pm3 located in the first region 1A, and the first through third auxiliary pixels Pa1, Pa2, and Pa3 located in the second region 2A may have different pixel arrangement structures. A pixel arrangement structure used herein will be described based on an emission area of each pixel. In this case, the emission area of the pixel may be defined by an opening of a pixel-defining film, which will be described below.

As shown in FIG. 6, main pixels located in the first region 1A may be arranged in a pentile structure. The main pixels located in the first region 1A may include the first main pixel Pm1, the second main pixel Pm2, and the third main pixel Pm3. The first main pixel Pm1, the second main pixel Pm2, and the third main pixel Pm3 may represent different colors. For example, the first main pixel Pm1 may emit light having a blue wavelength, the second main pixel Pm2 may emit light having a red wavelength, and the third main pixel Pm3 may emit light having a green wavelength.

A plurality of third main pixels Pm3 are located at certain intervals in a first row 1N, the second main pixel Pm2 and the first main pixel Pm1 are alternately located in a second row 2N adjacent to the first row 1N, a plurality of third main pixels Pm3 are located at certain intervals in a third row 3N adjacent to the second row 2N, the first main pixel Pm1 and the second main pixel Pm2 are alternately located in a fourth row 4N adjacent to the third row 3N, and such a pixel arrangement is repeated to an $N^{th}$ row. In this case, the first main pixel Pm1 and the second main pixel Pm2 may be larger than the third main pixel Pm3.

In this case, the plurality of third main pixels Pm3 located in the first row 1N, and the second main pixel Pm2 and the first main pixel Pm1 located in the second row 2N are alternately located. Accordingly, the second main pixel Pm2 and the first main pixel Pm1 are alternately located in a first column 1M, a plurality of third main pixels Pm3 are located at certain intervals in a second column 2M adjacent to the first column 1M, the first main pixel Pm1 and the second main pixel Pm2 are alternately located in a third column 3M adjacent to the second column 2M, a plurality of third main pixels Pm3 are located at certain intervals in a fourth column 4M, and such a pixel arrangement is repeated to an $M^{th}$ column.

In other words, from among vertices of a virtual quadrangular shape VS having a center point of the third main pixel Pm3 as a center point of the virtual quadrangular shape VS, the second main pixels Pm2 may be located at first and third vertices that face each other, and the first main pixels Pm1 may be located at second and fourth vertices that are the remaining vertices. In this case, the virtual quadrangular shape VS may be changed to any of various shapes, such as a rectangular shape, a diamond shape, or a square shape.

Such a pixel arrangement structure may be referred to as a pentile matrix structure, and, in this case, a rendering driving method that represents a color by sharing adjacent pixels may be used, thereby displaying an image having a high resolution with a small number of pixels.

Auxiliary pixels located in the second region 2A may be arranged in a pentile structure. The auxiliary pixels located in the second region 2A may include the first auxiliary pixel Pa1, the second auxiliary pixel Pa2, and the third auxiliary pixel Pa3. The first auxiliary pixel Pa1, the second auxiliary pixel Pa2, and the third auxiliary pixel Pa3 may represent different colors. For example, the first auxiliary pixel Pa1 may emit light having a blue wavelength, the second auxiliary pixel Pa2 may emit light having a red wavelength, and the third auxiliary pixel Pa3 may emit light having a green wavelength. In an embodiment, the first main pixel Pm1 and the first auxiliary pixel Pa1 may emit light having a same wavelength, the second main pixel Pm2 and the second auxiliary pixel Pa2 may emit light having a same wavelength, and the third main pixel Pm3 and the third auxiliary pixel Pa3 may emit light having a same wavelength.

A plurality of first auxiliary pixels Pa1 are located at certain intervals in the first row 1N, the second auxiliary pixel Pa2 and the third auxiliary pixel Pa3 are alternately located in the second row 2N adjacent to the first row 1N, a plurality of first auxiliary pixels Pa1 are located at certain intervals in the third row 3N adjacent to the second row 2N, the third auxiliary pixel Pa3 and the second auxiliary pixel Pa2 are alternately located in the fourth row 4N adjacent to the third row 3N, and such a pixel arrangement is repeated to the $N^{th}$ row. In this case, the first auxiliary pixel Pa1 may be larger than the second auxiliary pixel Pa2 and the third auxiliary pixel Pa3.

In this case, the plurality of first auxiliary pixels Pa1 located in the first row 1N and the second auxiliary pixel Pa2 and the third auxiliary pixel Pa3 located in the second row 2N are alternately located. Accordingly, the second auxiliary pixel Pa2 and the third auxiliary pixel Pa3 are alternately located in a first column 1I, a plurality of first auxiliary pixels Pa1 are located at certain intervals in a second column 2I adjacent to the first column 1I, the third auxiliary pixel Pa3 and the second auxiliary pixel Pa2 are alternately located in a third column 3I adjacent to the second column 2I, a plurality of first auxiliary pixels Pa1 are located at certain intervals in a fourth column 4I adjacent to the third column 3I, and such a pixel arrangement is repeated to an $I^{th}$ column.

In an embodiment, the main pixels Pm may be arranged in an RGBG pentile matrix structure in the first region 1A, and the auxiliary pixels Pa may be arranged in an RBGB pentile matrix structure, which is different from the RGBG pentile matrix arrangement structure of the main pixels Pm, in the second region 2A. For example, the main pixels Pm may be arranged in the first region 1A in an RGBG pentile matrix structure in which the second main pixel Pm2, the third main pixel Pm3, the first main pixel Pm1, and the third main pixel Pm3 are arranged in a pentile matrix structure, and the auxiliary pixels Pa may be arranged in the second region 2A in an RBGB pentile matrix structure in which the second auxiliary pixel Pa2, the first auxiliary pixel Pa1, the third auxiliary pixel Pa3, and the first auxiliary pixel Pa1 are arranged in a pentile matrix structure. In an embodiment, the main pixels Pm may be arranged in an RGBG/BGRG pentile matrix structure or an RGBG/RGBG pentile matrix in the first region 1A, and the auxiliary pixels Pa may be arranged in an RBGB/GBRB pentile matrix structure or an RBGB/RBGB pentile matrix structure in the second region 2A.

A plurality of transmission portions TA where a display element is not located and a light transmittance is high may be provided in the second region 2A. In an embodiment, the transmission portions TA may be alternately located in the x-direction and/or the y-direction. In another embodiment, each of the transmission portions TA may be around (e.g., surround) the plurality of auxiliary pixels Pa.

In the second region 2A, a basic unit U in which the plurality of auxiliary pixels Pa and the transmission portion TA are grouped may be repeatedly located in the x-direction and the y-direction.

The basic unit U may have a quadrangular shape in which the plurality of auxiliary pixels Pa and the transmission portion TA located around the plurality of auxiliary pixels Pa are grouped. The basic unit U is a repeating shape and does not mean separation of elements. For example, the transmission portion TA included in one basic unit U may be integrally formed with the transmission portion TA included in another adjacent basic unit U.

In the basic unit U, an area occupied by the plurality of auxiliary pixels Pa may be less than an area occupied by the transmission portion TA. For example, an area occupied by the plurality of auxiliary pixels Pa may be about ⅓ of that of the transmission portion TA. In other words, in an embodiment, an area occupied by the plurality of auxiliary pixels Pa may be about ¼ of that of the basic unit U, and an area occupied by the transmission portion TA may be about ¾ of that of the basic unit U.

The first through third auxiliary pixels Pa1, Pa2, and Pa3 may have a pixel arrangement structure different from that of the first through third main pixels Pm1, Pm2, and Pm3, and an emission area of the first through third auxiliary pixels Pa1, Pa2, and Pa3 may be larger than an emission area of the first through third main pixels Pm1, Pm2, and Pm3 emitting light having the same color wavelength.

Assuming that the first through third auxiliary pixels Pa1, Pa2, and Pa3 and the first through third main pixels Pm1, Pm2, and Pm3 have the same pixel arrangement structure, when the same current is applied to the first through third auxiliary pixels Pa1, Pa2, and Pa3 and the first through third main pixels Pm1, Pm2, and Pm3, a luminance of the second region 2A may be reduced as a whole. When more current is applied to the first through third auxiliary pixels Pa1, Pa2, and Pa3 in order to compensate for a luminance of the second region 2A, the first through third auxiliary pixels Pa1, Pa2, and Pa3 may be easily degraded. In this case, particularly, an organic light-emitting diode emitting light having a blue wavelength may be more easily degraded than an organic light-emitting diode emitting light of a different color.

In the present embodiment, because main pixels are arranged in an RGBG pentile matrix structure in a first region and auxiliary pixels are arranged in an RBGB pentile matrix structure in a second region including a transmission portion, the number of auxiliary pixels emitting light having a blue wavelength whose degradation speed is high may be increased, thereby increasing a lifespan of a display panel. Also, because an emission area of the auxiliary pixels located in the second region is larger than an emission area of the main pixels located in the first region, a resolution of the second region may be improved.

A corresponding unit U' having the same area as the area of the basic unit U may be set to the first region 1A. In this case, the number of the first through third main pixels Pm1, Pm2, and Pm3 included in the corresponding unit U' may be greater than the number of the first through third auxiliary pixels Pa1, Pa2, and Pa3 included in the basic unit U.

The first main pixel Pm1 located in the first region 1A may include a first main emission area EA1, and the first auxiliary pixel Pa1 located in the second region 2A may include a first auxiliary emission area EA1'. The first auxiliary emission area EA1' may have a first area 11, and the first main emission area EA1 may have a second area 12. In this case, the first area 11 of the first auxiliary emission area EA1' may be greater than the second area 12 of the first main emission area EA1. For example, the first area 11 may be 1.4 to 1.8 times that of the second area 12.

The second main pixel Pm2 located in the first region 1A may include a second main emission area EA2, and the second auxiliary pixel Pa2 located in the second region 2A may include a second auxiliary emission area EA2'. The second auxiliary emission area EA2' may have a third area 13, and the second main emission area EA2 may have a fourth area 14. In this case, the third area 13 of the second auxiliary emission area EA2' may be greater than the fourth area 14 of the second main emission area EA2. For example, the third area 13 may be 1.4 to 1.8 times that of the fourth area 14.

The third main pixel Pm3 located in the first region 1A may include a third main emission area EA3, and the third auxiliary pixel Pa3 located in the second region 2A may include a third auxiliary emission area EA3'. The third auxiliary emission area EA3' may have a fifth area 15, and the third main emission area EA3 may have a sixth area 16. In this case, the fifth area 15 of the third auxiliary emission area EA3' and the sixth area 16 of the third main emission area EA3 may be the same, or the fifth area 15 of the third auxiliary emission area EA3' may be greater than the sixth area 16 of the third main emission area EA3. For example, the fifth area 15 may be 1.4 to 1.8 times that of the sixth area 16.

An embodiment of FIG. 7 is different from an embodiment of FIG. 6 in that the area of an emission area of auxiliary pixels located in a second region is the same as the area of an emission area of main pixels located in a first region. The same elements of FIG. 7 as those of FIG. 6 will not be described, and the following will focus on a difference.

Referring to FIG. 7, the first through third main pixels Pm1, Pm2, and Pm3 are located in the first region 1A, and the first through third auxiliary pixels Pa1, Pa2, and Pa3 are located in the second region 2A including the transmission portion TA in a display apparatus, according to an embodiment of the present disclosure. The first through third main pixels Pm1, Pm2, and Pm3 located in the first region 1A and the first through third auxiliary pixels Pa1, Pa2, and Pa3 located in the second region 2A may have different pixel arrangement structures. The first through third main pixels Pm1, Pm2, and Pm3 located in the first region 1A may be arranged in an RGBG pentile matrix structure, and the first through third auxiliary pixels Pa1, Pa2, and Pa3 located in the second region 2A may be arranged in an RBGB pentile matrix structure. In an embodiment, the main pixels may be arranged in an RGBG/BGRG pentile matrix structure or an RGBG/RGBG pentile matrix structure in the first region 1A, and the auxiliary pixels may be arranged in an RBGB/GBRB pentile matrix structure or an RBGB/RBGB pentile matrix structure in the second region 2A.

The first main pixel Pm1 located in the first region 1A may include the first main emission area EA1, and the first auxiliary pixel Pa1 located in the second region 2A may include the first auxiliary emission area EA1'. The first auxiliary emission area EA1' may have the first area 11, and the first main emission area EA1 may have the second area 12. In this case, the first area 11 of the first auxiliary emission area EA1' may be equal to or greater than the second area 12 of the first main emission area EA1.

The second main pixel Pm2 located in the first region 1A may include the second main emission area EA2, and the second auxiliary pixel Pa2 located in the second region 2A may include the second auxiliary emission area EA2'. The second auxiliary emission area EA2' may have the third area 13, and the second main emission area EA2 may have the fourth area 14. In this case, the third area 13 of the second auxiliary emission area EA2' may be equal to or greater than the fourth area 14 of the second main emission area EA2.

The third main pixel Pm3 located in the first region 1A may include the third main emission area EA3, and the third auxiliary pixel Pa3 located in the second region 2A may include the third auxiliary emission area EA3'. The third auxiliary emission area EA3' may have the fifth area 15, and the third main emission area EA3 may have the sixth area 16. In this case, the fifth area 15 of the third auxiliary emission area EA3' may be equal to or greater than the sixth area 16 of the third main emission area EA3.

In a display panel, when an emission area of the first through third auxiliary pixels Pa1, Pa2, and Pa3 located in the second region 2A including the transmission portion TA increases, a transmittance of the second region 2A may decrease. Accordingly, because the first through third main pixels Pm1, Pm2, and Pm3 are arranged in an RGBG pentile matrix structure in the first region 1A and the first through third auxiliary pixels Pa1, Pa2, and Pa3 are arranged in an RBGB pentile matrix structure in the second region 2A, the number of auxiliary pixels emitting light having a blue wavelength whose degradation speed is high may be increased, thereby increasing a lifespan of the display panel.

Figure 8:
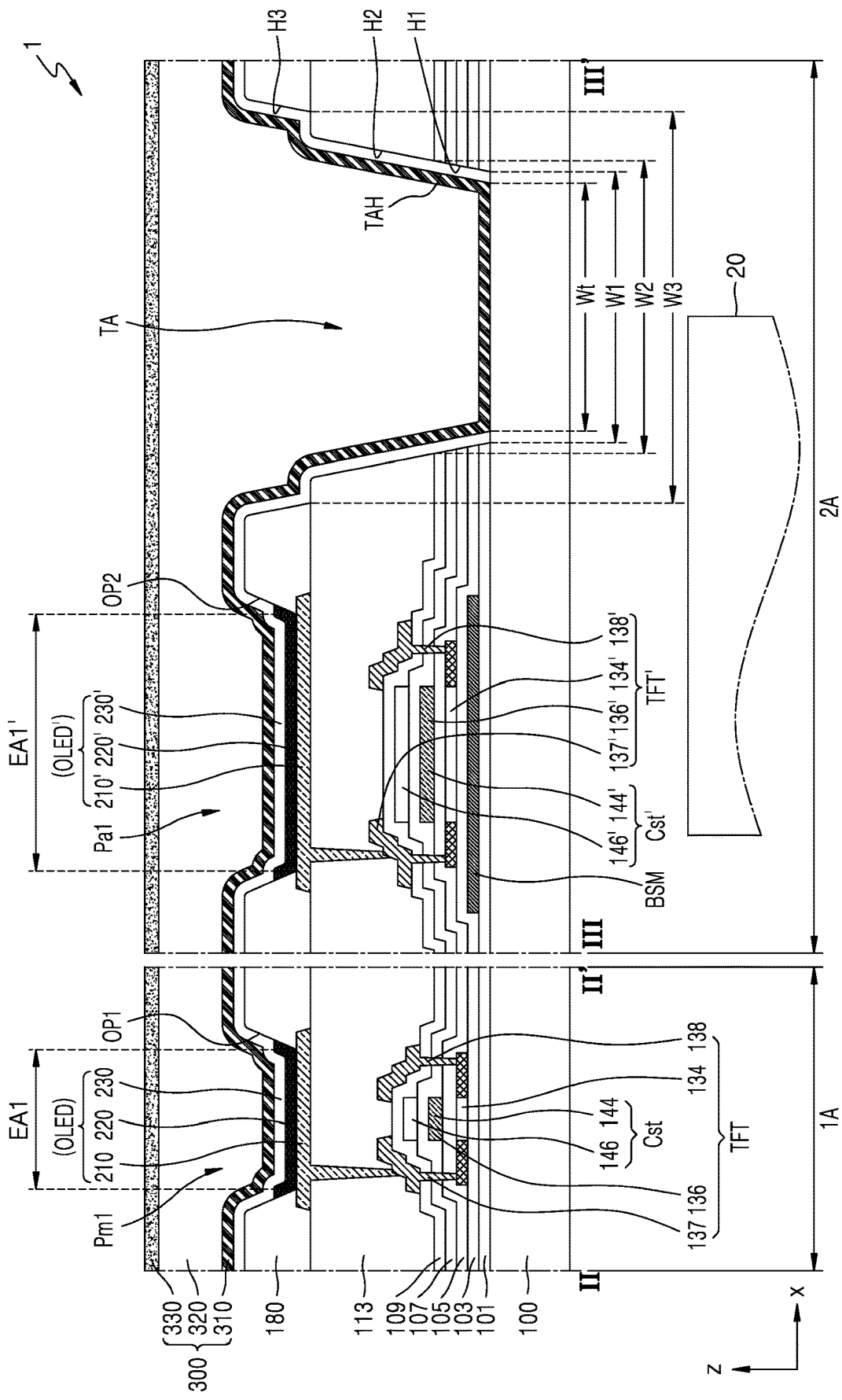
FIG. 8 is a cross-sectional view of a display apparatus according to an embodiment of the present disclosure, taken along the lines II-II' and III-III' of FIG. 6.

FIG. 8 is a cross-sectional view of a display apparatus according to an embodiment of the present disclosure, taken along the lines II-II' and III-III' of FIG. 6.

The main pixel Pm may include a main thin-film transistor TFT, a main storage capacitor Cst, and a main organic light-emitting diode OLED. The auxiliary pixel Pa may include an auxiliary thin-film transistor TFT', an auxiliary storage capacitor Cst', and an auxiliary organic light-emitting diode OLED'. An opening portion TAH corresponding to the transmission portion TA may be provided.

A component 20 may be located under the second region 2A. The component 20 may be a camera that captures an image or an infrared (IR) sensor that transmits/receives infrared rays. Because the second region 2A includes the transmission portion TA, light transmitted/received from the component 20 may be transmitted through the transmission portion TA. For example, light emitted by the component 20 may travel in a z-direction through the transmission portion TA, and light generated outside a display apparatus and incident on the component 20 may travel in a-z-direction through the transmission portion TA. In some embodiments, the component 20 may include a plurality of image sensors, and one image sensor may be located to correspond to one transmission portion TA.

A structure in which elements included in the display apparatus are stacked according to an embodiment of the present disclosure will now be described.

Referring to FIG. 8, the display apparatus 1 may include the main and auxiliary thin-film transistors TFT and TFT' and the main and auxiliary organic light-emitting diodes OLED and OLED' located on the substrate 100. In an embodiment, the substrate 100 may include a glass material or a polymer resin having $SiO_2$ as a main component. In an embodiment, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. In an embodiment, the substrate 100 may have a multi-layer structure including a layer including the polymer resin and an inorganic layer (not shown).

A buffer layer 101 may be located on the substrate 100 and may reduce or prevent penetration of a foreign material, moisture, or external air from the bottom of the substrate 100 and may planarize the substrate 100. The buffer layer 101 may include an inorganic material, such as oxide or nitride, an organic material, or a combination of an organic material and an inorganic material, and may have a single or multi-layer structure including an inorganic material and an organic material. In an embodiment, a barrier layer (not shown) for reducing or preventing penetration of external air may be further provided between the substrate 100 and the buffer layer 101.

The main thin-film transistor TFT and the auxiliary thin-film transistor TFT' may be located on the buffer layer 101. The main thin-film transistor TFT includes a main semiconductor layer 134, a main gate electrode 136, a main source electrode 137, and a main drain electrode 138, and the auxiliary thin-film transistor TFT' includes an auxiliary semiconductor layer 134', an auxiliary gate electrode 136', an auxiliary source electrode 137', and an auxiliary drain electrode 138'. The main thin-film transistor TFT may be connected to the main organic light-emitting diode OLED of the first region 1A and may drive the main organic light-emitting diode OLED. The auxiliary thin-film transistor TFT' may be connected to the auxiliary organic light-emitting diode OLED' of the second region 2A and may drive the auxiliary organic light-emitting diode OLED'.

A first insulating layer 103 may be located on the buffer layer 101. In an embodiment, the first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single or multi-layer structure including the above inorganic insulating material.

A lower electrode layer BSM may be located on the first insulating layer 103 of the second region 2A. The lower electrode layer BSM may be located under the auxiliary thin-film transistor TFT' to correspond to the auxiliary thin-film transistor TFT'. The lower electrode layer BSM may block external light from reaching the auxiliary pixel Pa including the auxiliary thin-film transistor TFT'. For example, the lower electrode layer BSM may block light emitted from the component 20 from reaching the auxiliary pixel Pa. In some embodiments, a constant voltage or a signal may be applied to the lower electrode layer BSM, thereby preventing or substantially preventing damage to a pixel circuit due to electrostatic discharge.

The main semiconductor layer 134 may be located on the first insulating layer 103 of the first region 1A, and may include a main channel region overlapping the main gate electrode 136 and a main source region and a main drain region located on both sides of the main channel region and having a higher impurity concentration than the main channel region. Impurities may include N-type impurities or P-type impurities. The main source region and the main drain region may be electrically connected to the main source electrode 137 and the main drain electrode 138 of the main thin-film transistor TFT.

The auxiliary semiconductor layer 134' may be located on the first insulating layer 103 of the second region 2A, and may include an auxiliary channel region overlapping the auxiliary gate electrode 136' and an auxiliary source region and an auxiliary drain region located on both sides of the auxiliary channel region and having a higher impurity concentration than the auxiliary channel region. Impurities may include N-type impurities or P-type impurities. The auxiliary source region and the auxiliary drain region may be electrically connected to the auxiliary source electrode 137' and the auxiliary drain electrode 138' of the auxiliary thin-film transistor TFT'.

In an embodiment, each of the main semiconductor layer 134 and the auxiliary semiconductor layer 134' may include an oxide semiconductor and/or a silicon semiconductor. When each of the main semiconductor layer 134 and the auxiliary semiconductor layer 134' is formed of an oxide semiconductor, each of the main semiconductor layer 134 and the auxiliary semiconductor layer 134' may include at least one oxide selected from the group consisting of, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, each of the main semiconductor layer 134 and the auxiliary semiconductor layer 134' may include InSnZnO (ITZO) or InGaZnO (IGZO). In an embodiment, when each of the main semiconductor layer 134 and the auxiliary semiconductor layer 134' is formed of a silicon semiconductor, each of the main semiconductor layer 134 and the auxiliary semiconductor layer 134' may include amorphous silicon (a-Si) or low-temperature polysilicon (LTPS) formed by crystallization of amorphous silicon (a-Si).

A second insulating layer 105 may be located on the main semiconductor layer 134 and the auxiliary semiconductor layer 134'. In an embodiment, the second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single or multi-layer structure including the above inorganic insulating material.

The main gate electrode 136 and the auxiliary gate electrode 136' may be located on the second insulating layer 105. In an embodiment, each of the main gate electrode 136 and the auxiliary gate electrode 136' may have a single or multi-layer structure formed of at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The main gate electrode 136 and the auxiliary gate electrode 136' may be connected to a gate line that applies an electrical signal to the main gate electrode 136 and the auxiliary gate electrode 136'.

A third insulating layer 107 may be located on the main gate electrode 136 and the auxiliary gate electrode 136'. In an embodiment, the third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single or multi-layer structure including the above inorganic insulating material.

The main storage capacitor Cst and the auxiliary storage capacitor Cst' may be located on the second insulating layer 105. The main storage capacitor Cst may include a main lower electrode 144 and a main upper electrode 146, the main storage capacitor Cst may overlap the main thin-film transistor TFT, and the main lower electrode 144 of the main storage capacitor Cst may be integrally formed with the main gate electrode 136 of the main thin-film transistor TFT. In an embodiment, the main storage capacitor Cst may not overlap the main thin-film transistor TFT, and the main lower electrode 144 of the main storage capacitor Cst may be an independent element separate from the main gate electrode 136 of the main thin-film transistor TFT.

The auxiliary storage capacitor Cst' may include an auxiliary lower electrode 144' and an auxiliary upper electrode 146', the auxiliary storage capacitor Cst' may overlap the auxiliary thin-film transistor TFT', and the auxiliary lower electrode 144' of the auxiliary storage capacitor Cst' may be integrally formed with the auxiliary gate electrode 136' of the auxiliary thin-film transistor TFT'. In an embodiment, the auxiliary storage capacitor Cst' may not overlap the auxiliary thin-film transistor TFT', and the auxiliary lower electrode 144' may be an independent element separate from the auxiliary gate electrode 136' of the auxiliary thin-film transistor TFT'.

In an embodiment, each of the main upper electrode 146 and the auxiliary upper electrode 146' may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single or multi-layer structure including the above material.

A fourth insulating layer 109 may be formed to cover the main upper electrode 146 and the auxiliary upper electrode 146'. In an embodiment, the fourth insulating layer 109 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The main source electrode 137 and the main drain electrode 138 may be located on the fourth insulating layer 109 of the first region 1A. In an embodiment, each of the main source electrode 137 and the main drain electrode 138 may include a conductive material including any of molybdenum (Mo), aluminum (Al), copper (Cu), and titanium (Ti), and may have a single or multi-layer structure including the above material. For example, each of the main source electrode 137 and the main drain electrode 138 may have a multi-layer structure formed of Ti/Al/Ti.

The auxiliary source electrode 137' and the auxiliary drain electrode 138' may be located on the fourth insulating layer 109 of the second region 2A. In an embodiment, each of the auxiliary source electrode 137' and the auxiliary drain electrode 138' may include a conductive material including any of molybdenum (Mo), aluminum (Al), copper (Cu), and titanium (Ti), and may have a single or multi-layer structure including the above material. For example, each of the auxiliary source electrode 137' and the auxiliary drain electrode 138' may have a multi-layer structure formed of Ti/Al/Ti.

A planarization layer 113 may be located on the main source electrode 137 and the main drain electrode 138 of the first region 1A and the auxiliary source electrode 137' and the auxiliary drain electrode 138' of the second region 2A. The planarization layer 113 may have a flat top surface such that a pixel electrode located over the planarization layer 113 is flat.

In an embodiment, when the first insulating layer 103, the second insulating layer 105, the third insulating layer 107, and the fourth insulating layer 109 are collectively referred to as an inorganic insulating layer, a stacked structure of the inorganic insulating layer on the substrate 100 may have a transmittance of about 90% or more for an infrared wavelength. For example, light having a wavelength from about 900 nm to about 1100 nm passing through the substrate 100 and the inorganic insulating layer may have a transmittance of about 90%.

The planarization layer 113 may have a single or multi-layer structure formed of an organic material or an inorganic material. The planarization layer 113 may include benzocyclobutene (BCB), polyimide (PI), hexamethyldisiloxane (HMDSO), a general-purpose polymer, such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, the planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In an embodiment, when the planarization layer 113 is formed, chemical mechanical polishing may be performed.

The planarization layer 113 may include an opening portion through which one of the main source electrode 137 and the main drain electrode 138 of the main thin-film transistor TFT is exposed, and a main pixel electrode 210 may contact the main source electrode 137 or the main drain electrode 138 through the opening portion and may be electrically connected to the main thin-film transistor TFT.

Also, the planarization layer 113 may include an opening portion through which one of the auxiliary source electrode 137' and the auxiliary drain electrode 138' of the auxiliary thin-film transistor TFT' is exposed, and an auxiliary pixel electrode 210' may contact the auxiliary source electrode 137' or the auxiliary drain electrode 138' through the opening portion and may be electrically connected to the auxiliary thin-film transistor TFT'.

In the first region 1A of the substrate 100, the main organic light-emitting diode OLED including the main pixel electrode 210, a main intermediate layer 220, and a main opposite electrode 230 facing the main pixel electrode 210 with the main intermediate layer 220 therebetween may be located on the planarization layer 113.

In the second region 2A of the substrate 100, the auxiliary organic light-emitting diode OLED' including the auxiliary pixel electrode 210', an auxiliary intermediate layer 220', and an auxiliary opposite electrode 230' facing the auxiliary pixel electrode 210' with the auxiliary intermediate layer 220' therebetween may be located on the planarization layer 113.

The main pixel electrode 210 and the auxiliary pixel electrode 210' may be located on the planarization layer 113. Each of the main pixel electrode 210 and the auxiliary pixel electrode 210' may be a (semi)light-transmitting electrode or a reflective electrode. In an embodiment, each of the main pixel electrode 210 and the auxiliary pixel electrode 210' may include a reflective film formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an embodiment, each of the main pixel electrode 210 and the auxiliary pixel electrode 210' may have a stacked structure including ITO/Ag/ITO.

A pixel-defining film 180 may be located on the planarization layer 113, and the pixel-defining film 180 may have a first opening OP1 through which at least a part of the main pixel electrode 210 is exposed and a second opening OP2 through which at least a part of the auxiliary pixel electrode 210' is exposed. The pixel-defining film 180 may increase a distance between an edge of the main pixel electrode 210 and the main opposite electrode 230 located over the main pixel electrode 210, thereby preventing or substantially preventing an arc or the like from occurring on the edge of the main pixel electrode 210, and may increase a distance between an edge of the auxiliary pixel electrode 210' and the auxiliary opposite electrode 230' located over the auxiliary pixel electrode 210', thereby preventing or substantially preventing an arc or the like from occurring on the edge of the auxiliary pixel electrode 210'. In an embodiment, the pixel-defining film 180 may be formed of an organic insulating material, such as polyimide, polyamide, acrylic resin, benzocyclobutene, hexamethyldisiloxane (HMDSO), or phenolic resin by using spin coating or the like.

An emission area of a main pixel may be defined by the first opening OP1 included in the pixel-defining film 180. For example, a first main emission area EA1 of the first main pixel Pm1 may be defined by the first opening OP1 of the first region 1A. An emission area of an auxiliary pixel may be defined by the second opening OP2 included in the pixel-defining film 180. For example, a first auxiliary emission area EA1' of the first auxiliary pixel Pa1 may be defined by the second opening OP2 of the second region 2A.

In an embodiment, when the planarization layer 113 and the pixel-defining film 180 are referred to as an organic insulating layer, the organic insulating layer may have a transmittance of about 90% or more for an infrared wavelength. For example, light having a wavelength from about 900 nm to about 1100 nm passing through the organic insulating layer may have a transmittance of about 90%.

The main intermediate layer 220 and the auxiliary intermediate layer 220' may be located in the first opening OP1 and the second opening OP2 of the pixel-defining film 180 to respectively correspond to the main pixel electrode 210 and the auxiliary pixel electrode 210'. Each of the main intermediate layer 220 and the auxiliary intermediate layer 220' may include an emission layer (EML), and may further selectively include functional layers, such as a hole transport layer (HTL), a hole injection layer (HIL), an electron transport layer (ETL), and an electron injection layer (EIL) located under and over the emission layer.

The emission layer may include an organic material including a fluorescent or phosphorescent material that emits red, green, blue, or white light. The emission layer may be formed of a low molecular weight organic material or a high molecular weight organic material.

In an embodiment, when the emission layer includes a low molecular weight organic material, each of the main intermediate layer 220 and the auxiliary intermediate layer 220' may have a single or stacked structure in which a hole injection layer, a hole transport layer, an emission layer, an electron transport layer, and an electron injection layer are stacked, and examples of the low molecular weight organic material may include various organic materials, such as copper phthalocyanine (CuPc), N,N'-Di(napthalene-1-yl)-N, N'-diphenyl-benzidine (NPB), and tris-8-hydroxyquinoline aluminum (Alq3). In an embodiment, the above layers may be formed by using vacuum deposition.

In an embodiment, when the emission layer includes a high molecular weight material, each of the main intermediate layer 220 and the auxiliary intermediate layer 220' may have a structure including a hole transport layer and an emission layer. In this case, the hole transport layer may include poly(3,4-ethylenedioxythiophene) (PEDOT), and the emission layer may include a high molecular weight material such as a poly-phenylenevinylene (PPV)-based material or a polyfluorene-based material. The emission layer may be formed by using any of various methods, such as screen printing, inkjet printing, or laser-induced thermal imaging (LITI).

The main opposite electrode 230 may be located on the main intermediate layer 220. In an embodiment, the main opposite electrode 230 may be located on the main intermediate layer 220 to entirely cover the main intermediate layer 220. In an embodiment, the main opposite electrode 230 may be located in the first region 1A to entirely cover the first region 1A. That is, the main opposite electrode 230 may be integrally formed to cover the plurality of main pixels Pm located in the first region 1A.

The auxiliary opposite electrode 230' may be located on the auxiliary intermediate layer 220'. In an embodiment, the auxiliary opposite electrode 230' may be located on the auxiliary intermediate layer 220' to entirely cover the auxiliary intermediate layer 220'.

The auxiliary opposite electrode 230' may include the opening portion TAH corresponding to the transmission portion TA. That is, the auxiliary opposite electrode 230' may have an opening corresponding to the transmission portion TA. In an embodiment, the opening of the auxiliary opposite electrode 230' may be formed by using a method of directly emitting a laser or a laser lift-off method using a sacrificial layer.

When the opening portion TAH corresponds to the transmission portion TA, it may mean that the opening portion TAH overlaps the transmission portion TA. In an embodiment, the area of the opening portion TAH may be less than the area of a first hole H1 formed in the inorganic insulating layer. To this end, in FIG. 8, a width Wt of the opening portion TAH is less than a width W1 of the first hole H1. The area of the opening portion TAH and the area of the first hole H1 may be defined as the area of a narrowest opening.

The width W1 of the first hole H1 formed in the inorganic insulating layer may be less than a width W2 of a second hole H2 formed in the planarization layer 113, and the width W2 of the second hole H2 formed in the planarization layer 113 may be less than a width W3 of a third hole H3 formed in the pixel-defining film 180.

In some embodiments, the auxiliary opposite electrode 230' and the first inorganic encapsulation layer 310 may be located at side surfaces of the first hole H1, the second hole H2, and the third hole H3. A gradient of the side surfaces of the first hole H1, the second hole H2, and the third hole H3 with respect to a top surface of the substrate 100 may be gentler than a gradient of a side surface of the opening portion TAH with respect to the top surface of the substrate 100.

When the opening portion TAH is formed, it means that a member such as an inorganic insulating layer and an organic insulating layer is removed from the transmission portion TA, and, thus, a light transmittance of the transmission portion TA may be significantly increased.

In another embodiment, the auxiliary opposite electrode 230' may be located in the second region 2A to entirely cover the second region 2A. That is, the auxiliary opposite electrode 230' may be integrally formed to cover the plurality of auxiliary pixels Pa located in the second region 2A, and may also be located on the transmission portion provided in the second region 2A.

In an embodiment, the main opposite electrode 230 and the auxiliary opposite electrode 230' may be integrally formed with each other. For example, the main opposite electrode 230 located in the first region 1A may extend to the second region 2A to also be located in the second region 2A.

Each of the main opposite electrode 230 and the auxiliary opposite electrode 230' may include a conductive material having a low work function. For example, each of the main opposite electrode 230 and the auxiliary opposite electrode 230' may include a semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an embodiment, each of the main opposite electrode 230 and the auxiliary opposite electrode 230' may further include a layer formed of ITO, IZO, ZnO, or $In_2O_3$ on the semi-transparent layer including the above material.

The main organic light-emitting diode OLED of the first region 1A and the auxiliary organic light-emitting diode OLED' of the second region 2A may be covered by the thin-film encapsulation layer 300. In an embodiment, the thin-film encapsulation layer 300 may include at least one inorganic encapsulation layer and at least one organic encapsulation layer. In an embodiment, the thin-film encapsulation layer 300 may include the first inorganic encapsulation layer 310, the second inorganic encapsulation layer 330, and the organic encapsulation layer 320 located between the first inorganic encapsulation layer 310 and the second inorganic encapsulation layer 330.

Each of the first inorganic encapsulation layer 310 and the second inorganic encapsulation layer 330 may include at least one inorganic insulating material. In an embodiment, the inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. In an embodiment, the polymer-based material may include any of an acrylic resin, an epoxy resin, polyimide, and polyethylene. For example, the organic encapsulation layer 320 may include an acrylic resin, such as polymethyl methacrylate or polyacrylic acid.

In an embodiment, a size of the second opening OP2 defining the first auxiliary emission area EA1' of the first auxiliary pixel Pa1 is greater than a size of the first opening OP1 defining the first main emission area EA1 of the first main pixel Pm1. Accordingly, when a same current is received, a luminance of the first auxiliary pixel Pa1 may be higher than that of the first main pixel Pm1.

Because the number of auxiliary pixels per basic unit U in the second region 2A is less than the number of main pixels per corresponding unit U', a luminance of the corresponding unit U' of the first region 1A and a luminance of the basic unit U of the second region 2A may be the same.

Figure 9:
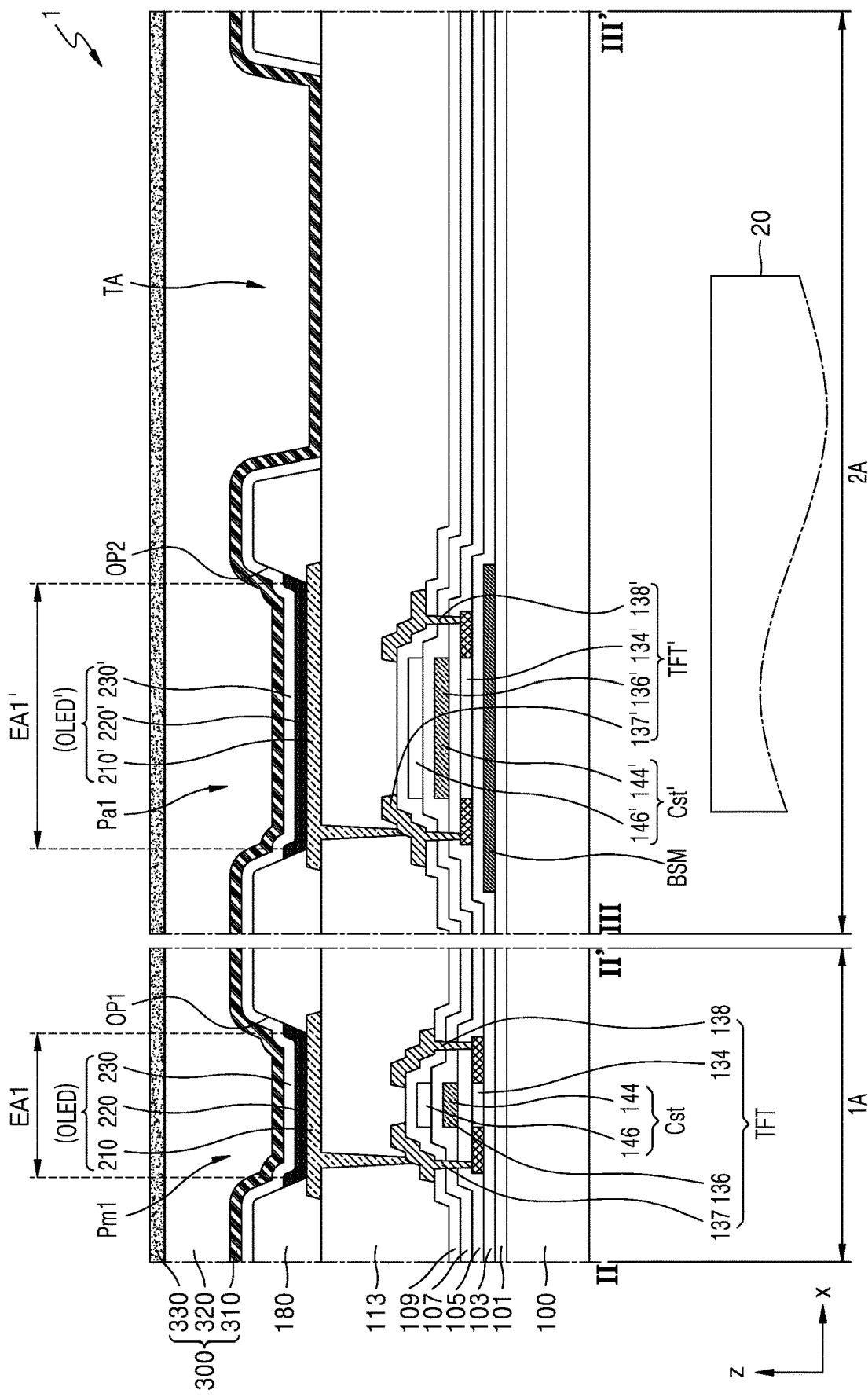
FIGS. 9 and 10 are cross-sectional views of a display apparatus according to some embodiments of the present disclosure, taken along lines corresponding to the lines II-II' and III-III' of FIG. 6.
Figure 10:
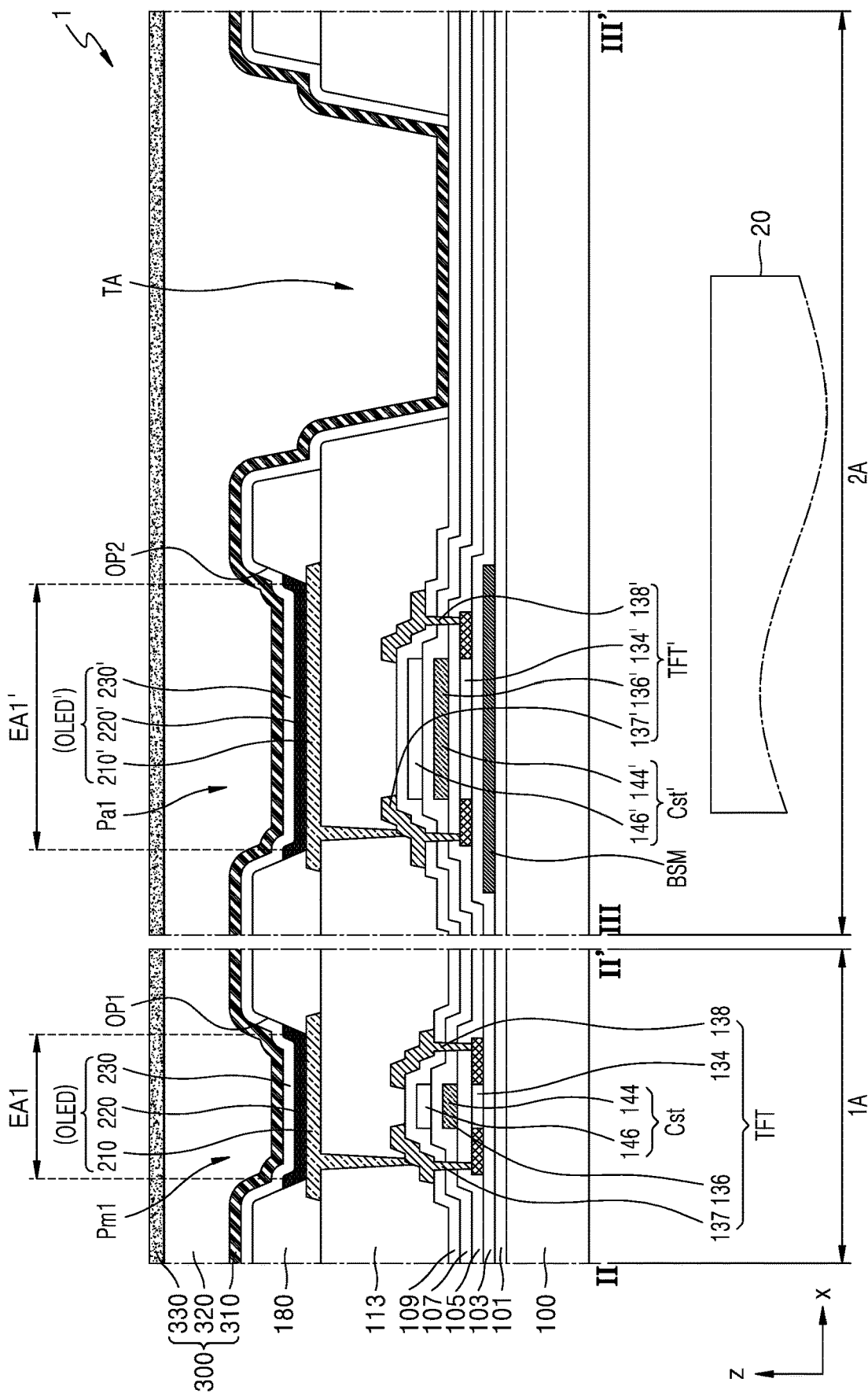

FIGS. 9 and 10 are cross-sectional view of a display apparatus according to some embodiments of the present disclosure, taken along lines corresponding to the lines II-II' and III-III' of FIG. 6. The embodiment of FIG. 9 is different from the embodiment of FIG. 8 in that an inorganic insulating layer and a planarization layer are located on the transmission portion TA provided in the second region 2A. The embodiment of FIG. 10 is different from the embodiment of FIG. 8 in that an inorganic insulating layer is located on the transmission portion TA provided in the second region 2A. Elements of FIGS. 9 and 10 which are the same as those of FIG. 8 will not be described, and the following description will focus on differences.

Referring to FIG. 9, an inorganic insulating layer including the first insulating layer 103, the second insulating layer 105, the third insulating layer 107, and the fourth insulating layer 109, and the planarization layer 113 may be located on the transmission portion TA provided in the second region 2A. Referring to FIG. 10, an inorganic insulating layer including the first insulating layer 103, the second insulating layer 105, the third insulating layer 107, and the fourth insulating layer 109 may be located on the transmission portion TA provided in the second region 2A.

Figure 11A:
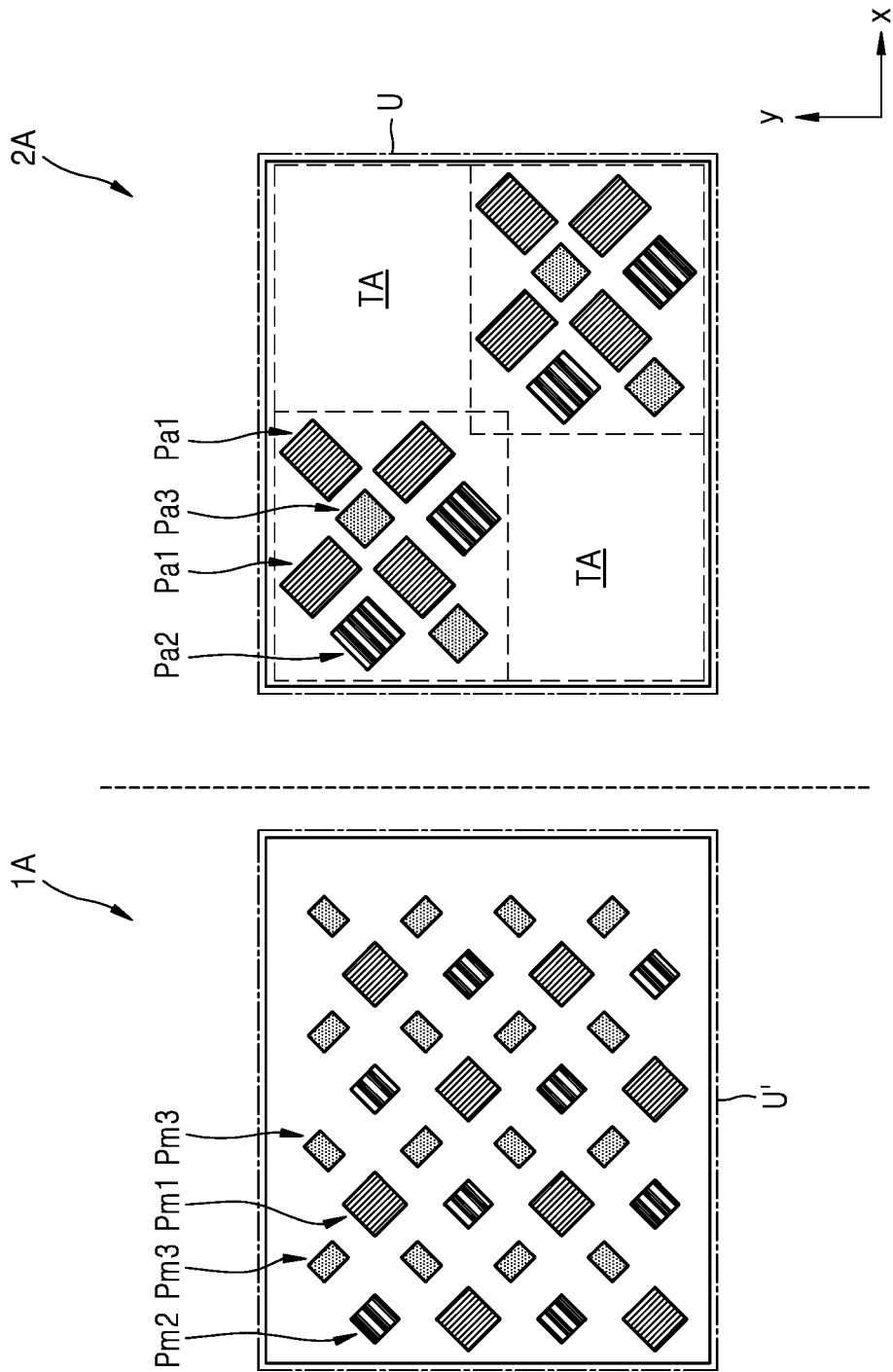

FIGS. 11A and 11B are plan views illustrating an arrangement of pixels and a transmission portion located in a first region and a second region according to some embodiments of the present disclosure. Embodiments of FIGS. 11A and 11B are different from the embodiments of FIGS. 6 and 7 in that more auxiliary pixels Pa are located in the second region 2A. Elements of FIGS. 11A and 11B which are the same as those of FIGS. 6 and 7 will not be described further, and the following description will focus on differences.

Referring to FIG. 11A, the main pixels Pm may be arranged in an RGBG pentile matrix structure in the first region 1A, and the auxiliary pixels Pa larger than the main pixels Pm located in the first region 1A may be arranged in an RBGB pentile matrix structure, which is different from the RGBG pentile matrix arrangement structure of the main pixels Pm, in the second region 2A. For example, the main pixels Pm may be arranged in the first region 1A in an RGBG pentile matrix structure in which the second main pixel Pm2, the third main pixel Pm3, the first main pixel Pm1, and the third main pixel Pm3 are arranged in a pentile matrix structure, and the auxiliary pixels Pa may be arranged in the second region 2A in an RBGB pentile matrix structure in which the second auxiliary pixel Pa2, the first auxiliary pixel Pa1, the third auxiliary pixel Pa3, and the first auxiliary pixel Pa1 are arranged in a pentile matrix structure. In an embodiment, the main pixels Pm may be arranged in an RGBG/BGRG pentile matrix structure or an RGBG/RGBG pentile matrix structure in the first region 1A, and the auxiliary pixels Pa may be arranged in an RBGB/GBRB pentile matrix structure or an RBGB/RBGB pentile matrix structure in the second region 2A.

In an embodiment, in the basic unit U, an area occupied by the plurality of auxiliary pixels Pa may be greater than an area occupied by the transmission portion TA. In an embodiment, an area occupied by the plurality of auxiliary pixels Pa may be slightly greater than half of the basic unit U.

In the basic unit U, because an area occupied by the plurality of auxiliary pixels Pa is increased, a lifespan of a display panel may be increased, and a resolution of the second region 2A may be improved.

Referring to FIG. 11B, the main pixels Pm may be arranged in an RGBG pentile matrix structure in the first region 1A, and the auxiliary pixels Pa may be arranged in an RBGB pentile matrix structure, which is different from the RGBG pentile matrix arrangement structure of the main pixels Pm, in the second region 2A. For example, the main pixels Pm may be arranged in the first region 1A in an RGBG pentile matrix in which the second main pixel Pm2, the third main pixel Pm3, the first main pixel Pm1, and the third main pixel Pm3 are arranged in a pentile matrix structure, and the auxiliary pixels Pa may be arranged in the second region 2A in an RBGB pentile matrix structure in which the second auxiliary pixel Pa2, the first auxiliary pixel Pa1, the third auxiliary pixel Pa3, and the first auxiliary pixel Pa1 are arranged in a pentile matrix structure. In an embodiment, the main pixels Pm may be arranged in an RGBG/BGRG pentile matrix structure or an RGBG/RGBG pentile matrix structure in the first region 1A, and the auxiliary pixels Pa may be arranged in an RBGB/GBRB pentile matrix structure or an RBGB/RBGB pentile matrix structure in the second region 2A.

In an embodiment, in the basic unit U, an area occupied by the plurality of auxiliary pixels Pa may be the same as an area occupied by the transmission portion TA. In other words, an area occupied by the plurality of auxiliary pixels Pa may be about ½ of that of the basic unit U, and an area occupied by the transmission portion TA may be about ½ of that of the basic unit U.

In the basic unit U, because an area occupied by the plurality of auxiliary pixels Pa is increased, a lifespan of a display panel may be increased and a resolution of the second region 2A may be improved.

Figure 12B:
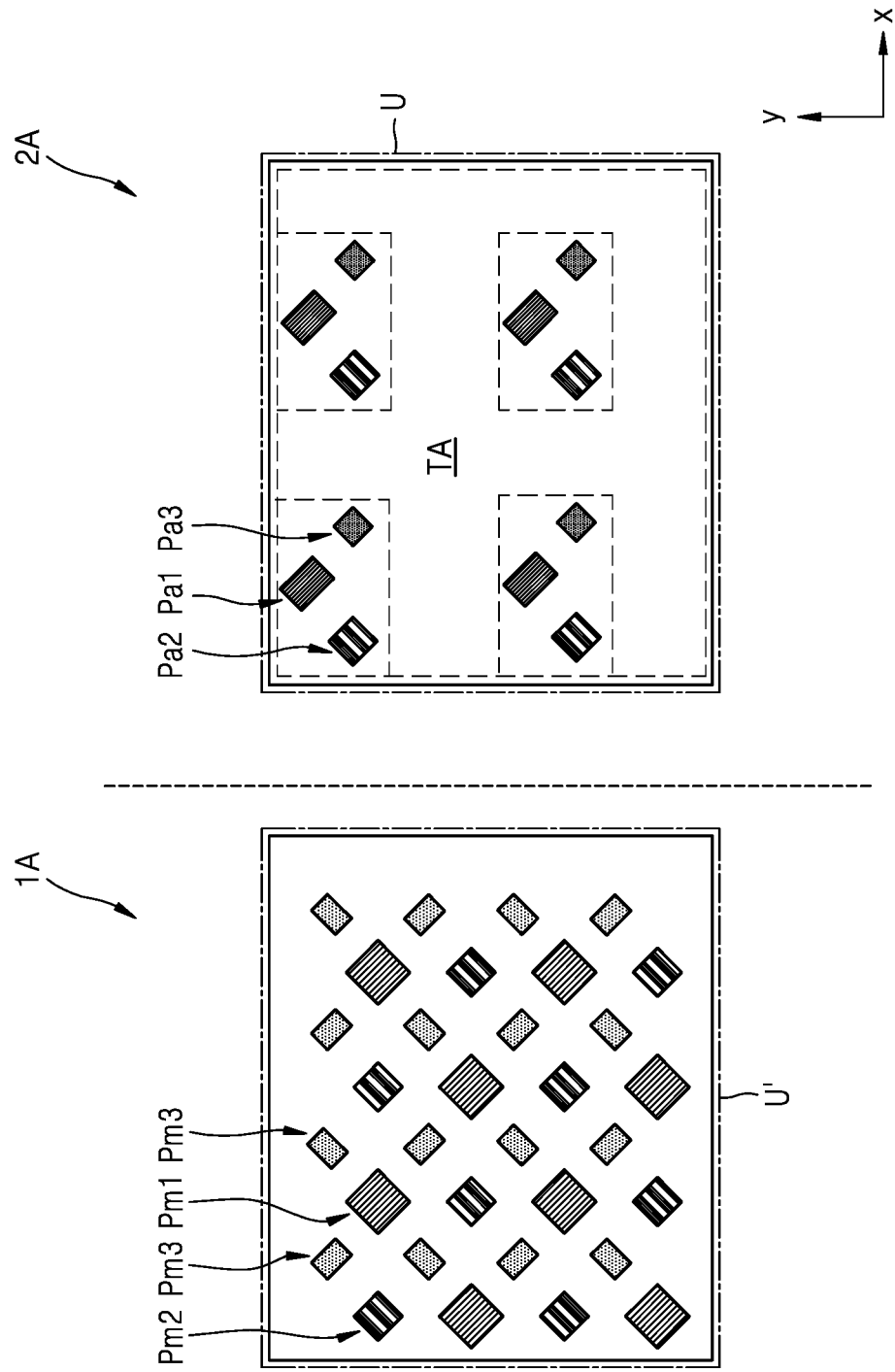

FIGS. 12A and 12B are plan views illustrating an arrangement of pixels and a transmission portion located in a first region and a second region according to some embodiments of the present disclosure. Embodiments of FIGS. 12A and 12B are different from the embodiments of FIGS. 6 and 7 in that more auxiliary pixels Pa are located in the second region 2A. Elements of FIGS. 12A and 12B which are the same as those of FIGS. 6 and 7 will not be described further, and the following description will focus on differences.

Referring to FIG. 12A, in an embodiment, the main pixels Pm may be arranged in an RGBG pentile matrix structure in the first region 1A, and the auxiliary pixels Pa larger than the main pixels Pm located in the first region 1A may be arranged in an RBG pentile matrix structure, which is different from the RGBG pentile matrix arrangement structure of the main pixels Pm, in the second region 2A. For example, the main pixels Pm may be arranged in the first region 1A in an RGBG pentile matrix structure in which the second main pixel Pm2, the third main pixel Pm3, the first main pixel Pm1, and the third main pixel Pm3 are arranged in a pentile matrix structure, and the auxiliary pixels Pa may be arranged in the second region 2A in an RBG pentile matrix structure in which the second auxiliary pixel Pa2, the first auxiliary pixel Pa1, and the third auxiliary pixel Pa3 are arranged in a pentile matrix structure. In an embodiment, the main pixels Pm may be arranged in an RGBG/BGRG pentile matrix structure or an RGBG/RGBG pentile matrix structure in the first region 1A.

In an embodiment, in the basic unit U, an area occupied by the plurality of auxiliary pixels Pa may be less than an area occupied by the transmission portion TA. For example, an area occupied by the plurality of auxiliary pixels Pa may be less than ½ and greater than ⅜ of that of the basic unit U.

In the basic unit U, because an area occupied by the plurality of auxiliary pixels Pa is increased, a lifespan of a display panel may be increased and a resolution of the second region 2A may be improved.

Referring to FIG. 12B, in an embodiment, the main pixels Pm may be arranged in an RGBG pentile matrix structure in the first region 1A, and the auxiliary pixels Pa may be arranged in an RBG pentile matrix structure, which is different from the RGBG pentile matrix arrangement structure of the main pixels Pm, in the second region 2A. For example, the main pixels Pm may be arranged in the first region 1A in an RGBG pentile matrix structure in which the second main pixel Pm2, the third main pixel Pm3, the first main pixel Pm1, and the third main pixel Pm3 are arranged in a pentile matrix structure, and the auxiliary pixels Pa may be arranged in the second region 2A in an RBG pentile matrix structure in which the second auxiliary pixel Pa2, the first auxiliary pixel Pa1, and the third auxiliary pixel Pa3 are arranged in a pentile matrix structure. In an embodiment, the main pixels Pm may be arranged in an RGBG/BGRG pentile matrix structure or an RGBG/RGBG pentile matrix structure in the first region 1A.

In an embodiment, in the basic unit U, an area occupied by the plurality of auxiliary pixels Pa may be less than an area occupied by the transmission portion TA. For example, an area occupied by the plurality of auxiliary pixels Pa may be about ⅜ of that of the basic unit U, and an area occupied by the transmission portion TA may be about ⅝ of that of the basic unit U.

In the basic unit U, because an area occupied by the plurality of auxiliary pixels Pa is increased, a lifespan of a display panel may be increased and a resolution of the second region 2A may be improved.

According to one or more embodiments of the present disclosure, to avoid a problem of a conventional display apparatus such as degradation of an organic light-emitting diode of a second region including a transmission portion, an arrangement structure of main pixels included in a first region may be different from an arrangement structure of auxiliary pixels included in a second region, thereby providing a display apparatus having improved reliability.

Although only a display apparatus has been mainly described, the present disclosure is not limited thereto. For example, a method of manufacturing such a display apparatus is also within the scope of the present disclosure.

According to one or more embodiments of the present disclosure, because an arrangement structure of main pixels included in a first region is different from an arrangement structure of auxiliary pixels included in a second region, a display apparatus having improved reliability may be provided. However, the scope of the present disclosure is not limited to the above aspect or effect.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display panel comprising:
    a substrate comprising a first region and a second region, the second region comprising a transmission portion;
    main pixels located in the first region, comprising a first main pixel, a second main pixel, and a third main pixel, and arranged in a RGBG pentile matrix structure;
    auxiliary pixels located in the second region, comprising a first auxiliary pixel, a second auxiliary pixel, and a third auxiliary pixel, and arranged in a RBGB pentile matrix structure different from the RGBG pentile matrix structure of the main pixels, a number of the auxiliary pixels located per unit area in the second region being less than a number of the main pixels located per unit area in the first region; and
    a lower electrode layer located between the substrate and an auxiliary thin-film transistor, wherein the lower electrode layer, in a plan view, is overlapping with an auxiliary emission area of an auxiliary pixel of the auxiliary pixels and is outside the transmission portion,
    wherein the first auxiliary pixel comprises a first auxiliary emission area and an auxiliary opposite electrode, and the first main pixel, which emits light having a same wavelength as the first auxiliary pixel, comprises a first main emission area,
    wherein the first auxiliary emission area has a first area, and the first main emission area has a second area smaller than the first area,
    wherein the auxiliary opposite electrode comprises a first opening corresponding to the transmission portion,
    wherein the display panel further comprises a thin-film encapsulation layer located on the auxiliary opposite electrode, and the thin-film encapsulation layer overlaps the first opening,
    wherein the display panel further comprises an inorganic insulating layer located on the substrate, and the inorganic insulating layer comprises a second opening corresponding to the transmission portion, and
    wherein the second opening exposes at least a portion of the substrate.

2. The display panel of claim 1, wherein the first area is 1.4 to 1.8 times that of the second area.

3. The display panel of claim 1, wherein the second auxiliary pixel comprises a second auxiliary emission area, and the second main pixel, which emits light having a same wavelength as the second auxiliary pixel, comprises a second main emission area, and the second auxiliary emission area has a third area, and the second main emission area has a fourth area smaller than the third area.

4. The display panel of claim 3, wherein the third area is 1.4 to 1.8 times that of the fourth area.

5. The display panel of claim 3, wherein the third auxiliary pixel comprises a third auxiliary emission area, and the third main pixel, which emits light having a same wavelength as the third auxiliary pixel, comprises a third main emission area, and the third auxiliary emission area has a fifth area, and the third main emission area has a sixth area smaller than the fifth area.

6. The display panel of claim 5, wherein the fifth area is 1.4 to 1.8 times that of the sixth area.

7. The display panel of claim 5, wherein the first auxiliary pixel and the first main pixel emit light having a blue wavelength, the second auxiliary pixel and the second main pixel emit light having a red wavelength, and the third auxiliary pixel and the third main pixel emit light having a green wavelength.

8. The display panel of claim 7, wherein the RGBG pentile matrix structure comprises one first main pixel, one second main pixel, and two third main pixels.

9. The display panel of claim 7, wherein the RBGB pentile matrix structure comprises two first auxiliary pixels, one second auxiliary pixel, and one third auxiliary pixel.

10. The display panel of claim 1, wherein a basic unit comprising the auxiliary pixels and the transmission portion are repeatedly arranged in the second region.

11. The display panel of claim 1, further comprising an organic insulating layer located on the substrate, wherein the organic insulating layer comprises an opening corresponding to the transmission portion.

12. The display panel of claim 1, wherein at least a part of the second region is surrounded by the first region.

13. A display apparatus comprising:

a display panel comprising a substrate comprising a first region and a second region, the second region comprising a transmission portion; and a component located to correspond to the second region of the display panel, wherein the display panel comprises:

main pixels located in the first region, comprising a first main pixel, a second main pixel, and a third main pixel, and arranged in a RGBG pentile matrix structure;

auxiliary pixels located in the second region, comprising a first auxiliary pixel, a second auxiliary pixel, and a third auxiliary pixel, and arranged in a RBGB pentile matrix structure different from the RGBG pentile matrix structure of the main pixels, a number of the auxiliary pixels located per unit area in the second region being less than a number of the main pixels located per unit area in the first region; and a lower electrode layer located between the substrate and an auxiliary thin-film transistor, wherein the lower electrode layer, in a plan view, is overlapping with an auxiliary emission area of an auxiliary pixel of the auxiliary pixels and is outside the transmission portion, wherein the first auxiliary pixel comprises a first auxiliary emission area and an auxiliary opposite electrode, and the first main pixel, which emits light having a same wavelength as the first auxiliary pixel, comprises a first main emission area, wherein the first auxiliary emission area has a first area, and the first main emission area has a second area equal to or smaller than the first area, wherein the auxiliary opposite electrode comprises a first opening corresponding to the transmission portion, wherein the display panel further comprises a thin-film encapsulation layer located on the auxiliary opposite electrode, and the thin-film encapsulation layer overlaps the first opening, wherein the display panel further comprises an inorganic insulating layer located on the substrate, and the inorganic insulating layer comprises a second opening corresponding to the transmission portion, and wherein the second opening exposes at least a portion of the substrate.

14. The display apparatus of claim 13, wherein the first area is 1 to 1.8 times that of the second area.

15. The display apparatus of claim 13, wherein the first auxiliary pixel and the first main pixel emit light having a blue wavelength, the second auxiliary pixel and the second main pixel emit light having a red wavelength, and the third auxiliary pixel and the third main pixel emit light having a green wavelength.

16. The display apparatus of claim 15, wherein the RGBG pentile matrix structure comprises one first main pixel, one second main pixel, and two third main pixels.

17. The display apparatus of claim 15, wherein the RBGB pentile matrix structure comprises two first auxiliary pixels, one second auxiliary pixel, and one third auxiliary pixel.

18. The display apparatus of claim 13, wherein the component comprises an imaging device.

* * * * *